United States Patent
Nagasawa et al.

(10) Patent No.: US 9,897,917 B2
(45) Date of Patent: Feb. 20, 2018

(54) CONDUCTIVE POLYMER COMPOSITION, COATED ARTICLE, AND PATTERNING PROCESS

(71) Applicant: SHIN-ETSU CHEMICAL CO., LTD., Tokyo (JP)

(72) Inventors: Takayuki Nagasawa, Jyoetsu (JP); Jun Hatakeyama, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/182,036

(22) Filed: Jun. 14, 2016

(65) Prior Publication Data

US 2017/0010534 A1    Jan. 12, 2017

(30) Foreign Application Priority Data

Jul. 9, 2015    (JP) .................. 2015-138176

(51) Int. Cl.
    *G03F 7/09*    (2006.01)
    *H05F 1/02*    (2006.01)
    (Continued)

(52) U.S. Cl.
    CPC ............. *G03F 7/093* (2013.01); *C08F 12/30* (2013.01); *C08F 212/14* (2013.01); *C08L 25/18* (2013.01);
    (Continued)

(58) Field of Classification Search
    CPC .......... C08L 65/00; C08L 25/18; C08L 33/16; C08L 35/02; C08L 27/12; C08L 41/00; C08L 25/14; C08F 212/14; C08F 220/38; C08F 12/30; C08F 2220/382; C08F 220/24; C09D 165/00; C09D 125/18; C09D 133/16; C09D 135/02; C09D 5/24; C08G 2261/1424; C08G 2261/3223; C08G 2261/794; G03F 7/093; G03F 7/004; G03F 7/0045; G03F 7/0046; G03F 7/038; G03F 7/0382; G03F 7/0388; G03F 7/0397; G03F 7/2041; H01B 1/127; H01B 1/128;
    (Continued)

(56) References Cited

U.S. PATENT DOCUMENTS 5,370,825 A    12/1994    Angelopoulos et al.
5,437,893 A    8/1995    Murai et al.
(Continued)

FOREIGN PATENT DOCUMENTS

EP    2 947 126 A1    11/2015
JP    2902727 B2    6/1999
(Continued)

OTHER PUBLICATIONS

Oct. 26, 2016 Search Report issued in European Patent Application No. 16001488.2.

*Primary Examiner* — Mark Kopec
*Assistant Examiner* — Jaison P Thomas
(74) *Attorney, Agent, or Firm* — Oliff PLC

(57) ABSTRACT

The present invention provides a conductive polymer composition including: (A) a π-conjugated conductive polymer having at least one repeating unit shown by the following general formulae (1-1), (1-2), and (1-3); and (B) a dopant polymer which contains a repeating unit "a" shown by the following general formula (2) and has a weight-average molecular weight in a range of 1,000 to 500,000. The inventive conductive polymer composition has excellent antistatic performance in electron beam-resist drawing as well as good applicability onto a resist and peelability with $H_2O$ and an alkaline solution, thereby being suitably used for electron beam lithography.

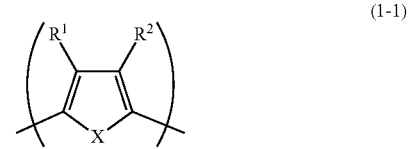

(1-1)

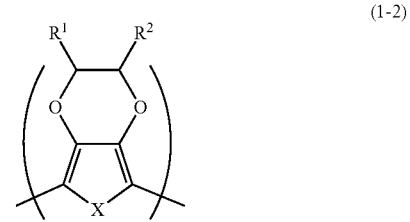

(1-2)

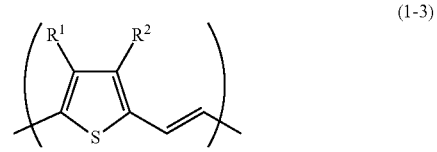

(1-3)

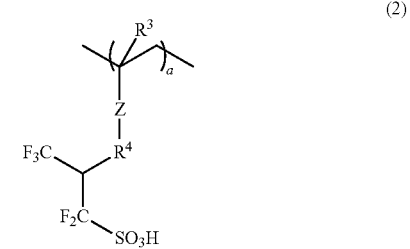

(2)

8 Claims, No Drawings

(51) Int. Cl.

| | | |
|---|---|---|
| *H01L 21/027* | (2006.01) | |
| *C09D 5/24* | (2006.01) | |
| *C08L 33/16* | (2006.01) | |
| *C08L 25/18* | (2006.01) | |
| *C08L 35/02* | (2006.01) | |
| *C09D 133/16* | (2006.01) | |
| *C09D 125/18* | (2006.01) | |
| *C09D 135/02* | (2006.01) | |
| *C08F 12/30* | (2006.01) | |
| *C08F 212/14* | (2006.01) | |
| *H01B 1/12* | (2006.01) | |

(52) U.S. Cl.
CPC ............... *C08L 33/16* (2013.01); *C08L 35/02* (2013.01); *C09D 5/24* (2013.01); *C09D 125/18* (2013.01); *C09D 133/16* (2013.01); *C09D 135/02* (2013.01); *H01B 1/127* (2013.01); *H01L 21/0277* (2013.01); *H05F 1/02* (2013.01); *C08G 2261/1424* (2013.01); *C08G 2261/3223* (2013.01); *C08G 2261/794* (2013.01)

(58) Field of Classification Search
CPC ..... H01B 1/122; H01B 1/125; H01L 21/0277; H05F 1/02; Y10S 430/114; Y10S 430/115; Y10S 430/143
See application file for complete search history.

(56) References Cited

U.S. PATENT DOCUMENTS

| | | | | |
|---|---|---|---|---|
| 9,017,924 | B2* | 4/2015 | Takaki | G03F 7/0388 430/270.1 |
| 9,493,597 | B2* | 11/2016 | Hatakeyama | C08F 220/38 |
| 9,657,115 | B2* | 5/2017 | Hatakeyama | C08F 8/00 |
| 2006/0237695 | A1* | 10/2006 | Williams | B82Y 10/00 252/500 |
| 2009/0014693 | A1* | 1/2009 | Zahn | C07D 517/04 252/510 |
| 2012/0012795 | A1* | 1/2012 | Hsu | C08L 65/00 252/500 |
| 2013/0224659 | A1* | 8/2013 | Ohashi | C08F 220/18 430/285.1 |
| 2015/0140492 | A1 | 5/2015 | Sawai et al. | |
| 2015/0175722 | A1* | 6/2015 | Hatakeyama | C08F 12/20 525/326.2 |
| 2015/0175730 | A1* | 6/2015 | Hatakeyama | C08F 220/38 525/326.2 |
| 2015/0301449 | A1* | 10/2015 | Ohashi | G03F 7/027 430/285.1 |
| 2015/0340118 | A1* | 11/2015 | Nagasawa | H01L 51/0037 252/500 |
| 2016/0078977 | A1 | 3/2016 | Hatakeyama et al. | |

FOREIGN PATENT DOCUMENTS

| | | | | |
|---|---|---|---|---|
| JP | 2013-228447 | A | 11/2013 | |
| JP | 2014-009342 | A | 1/2014 | |
| KR | 2015073094 | * | 6/2015 | ............... H01B 1/00 |
| KR | 2015075370 | * | 7/2015 | ............... H01B 1/00 |

\* cited by examiner

US 9,897,917 B2

CONDUCTIVE POLYMER COMPOSITION, COATED ARTICLE, AND PATTERNING PROCESS

BACKGROUND OF THE INVENTION

Field of the Invention

The present invention relates to a conductive polymer composition containing a π-conjugated conductive polymer, a coated article using the same, and a patterning process. Specifically, the present invention relates to a conductive polymer composition that is suitably used for prevention of electrification of a resist in lithography using ultraviolet light, electron beam, or the like; a coated article having an antistatic film formed by using the same; and a patterning process using the conductive polymer composition.

Description of the Related Art

Conventionally, in the fabrication process of a semiconductor device such as IC and LSI, microprocessing by lithography using a photoresist has been employed. This is a method of etching a substrate by using a resist pattern as a mask, in which the resist pattern is obtained by irradiating a thin film with light to induce crosslinking or decomposition reaction, thereby changing the solubility of the thin film, and subjecting the same to development treatment with a solvent or the like. In recent years, as a semiconductor device advances toward high integration, high-precision microprocessing using a beam with short wavelength have been required. The development of lithography using electron beam has been progressed for next generation technique because of its short-wavelength properties.

The lithography using electron beam has a specific problem of electrification phenomenon (charge-up) during exposure. This is a phenomenon that when a substrate to be irradiated with electron beam is coated with an insulating resist film, it is charged by accumulation of electric charge on or in the resist film. An orbit of incident electron beam is bent by the electrification, and therefore the precision of drawing is significantly reduced. Accordingly, an antistatic film to be applied on an electron beam resist has been investigated.

In the lithography using an electron beam, accurate positioning has been more important in an electron beam-drawing of a resist due to miniaturization to <10 nm generation. As the drawing technology, it has been developing higher electric current in prior arts, MBMW (multi beam mask writing), and so on, and it is presumed that the resist will be electrified more severely thereby. Accordingly, a conductive polymer with lower resistivity and higher ability to release the charge is required as a means to improve the antistatic performance of an antistatic film coping with the development of drawing technology from now on.

In order to suppress lowering of drawing accuracy due to electrification on a resist, Patent Document 1 discloses that the resist is coated with a π-conjugated conductive polymer having an introduced acidic substituent in the structure, and thus formed conductive polymer film shows an antistatic effect in electron-beam drawing, thereby dissolving various faults due to electrification such as a deformation of a resist pattern or an electrostatic adverse effect to accurate positioning of lithography in an electron beam irradiation. It is also revealed that the conductive polymer film retains water solubility even after electron beam-drawing with high irradiation dose, and accordingly can be removed by water washing.

Patent Document 2 discloses a composition composed of a polyaniline-based conductive polymer, polyacid, and $H_2O$; and reveals that when the composite composed of a polyaniline-based conductive polymer and polyacid is 5 to 10% by mass, film forming by spin coating can be performed, and in addition to this, when the film thickness is 150 nm, antistatic performance is observed, and the antistatic film thus formed can be peeled and washed with $H_2O$.

PRIOR ART DOCUMENTS

Patent Documents

Patent Document 1: Japanese Patent No. 2902727
Patent Document 2: U.S. Pat. No. 5,370,825
Patent Document 3: Japanese Patent Laid-Open Publication No. 2014-009342

SUMMARY OF THE INVENTION

The antistatic film for electron beam drawing revealed in Patent Document 1 uses a π-conjugated conductive polymer in which an acidic substituent is introduced into one monomer unit structure thereof, and the acidic substituent is self-doped into the π-conjugated conductive polymer chain. Accordingly, the acidic substituent and the monomer composing the π-conjugated conductive polymer are always contained in a ratio of 1:1, which makes it difficult to alter the doping ratio of the n-conjugated conductive polymer and the acidic substituent in order to adapt it to the use and the object. Moreover, it is also difficult to alter the ratio of the undoped acidic substituent, which largely influences properties such as solubility or dispersity to $H_2O$, and re-aggregation. Accordingly, there has been a problem such as causing re-aggregation during the storage to make the liquid heterogeneous and to generate a defect easily in peeling step when applied as an antistatic film onto a resist.

In the composition disclosed in Patent Document 2, the composite composed of the polyaniline-based conductive polymer and polyacid has high $H_2O$-affinity among various composites composed of π-conjugated conductive polymers and polyacids, and accordingly shows rapid response in a $H_2O$-peeling and washing step in the use of an antistatic film for electron beam lithography. On the other hand, its low resistivity, which is a property index to show antistatic performance, is hard to be improved remarkably. Accordingly, the composition can fail to cope with releasing the charge sufficiently in a prospective drawing process, which will intensely generate the foregoing electrification condition of a resist layer.

As regards to this, π-conjugated conductive polymers used for a use of an antistatic film include a polythiophene-based conductive polymer, which generally shows higher conductivity compared to a polyaniline-based conductive polymer for the same use. The polythiophene-based conductive polymer, however, has lower affinity to $H_2O$ compared to a polyaniline-based conductive polymer, and the formed film is not fully dissolved but is peeled in a form of flakes in a $H_2O$-peeling and washing step after forming the film even when the material was dispersed into $H_2O$, thereby causing a serious defect in lithography.

Patent Document 3 discloses a technology used for an antistatic film for electron beam lithography of a polythiophene-based conductive polymer, which reveals a composite of a polythiophene-based conductive polymer and polyanion having an antistatic film function and peelability to $H_2O$ effected by an addition of gemini surfactant, etc. To add the favorable functions of applicability and peelability, however, some additives other than the gemini surfactant are used in the composition. As a result, when compared to the polyaniline-based antistatic film, it is shown that the surface resistivity (Ω/□) of the film, which is an index of antistatic performance, is equivalent or larger, and accordingly the film fails to reveal the efficiency of high conductivity of the polythiophene-based conductive polymer. Therefore, it is feared to fail to cope with the sufficient releasing of the charge in a drawing process, requiring high antistatic property in future.

On account of the foregoing, it has been required to develop an antistatic film for electron beam-resist drawing having good applicability onto a resist, excellent antistatic performance in an electron beam-resist drawing step, and good peelability with H₂O or an alkaline developer after the drawing.

The present invention was made in view of the above circumstances, and an object thereof is to provide a conductive polymer composition that has excellent antistatic performance in electron beam-resist drawing, good applicability onto a resist and peelability with H₂O and an alkaline solution, thereby being suitably used in electron beam lithography.

To accomplish the object, the present invention provides a conductive polymer composition comprising:

(A) a π-conjugated conductive polymer having at least one repeating unit shown by the following general formulae (1-1), (1-2), and (1-3); and (B) a dopant polymer which contains a repeating unit "a" shown by the following general formula (2) and has a weight-average molecular weight in a range of 1,000 to 500,000;

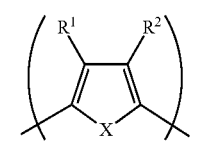
(1-1)

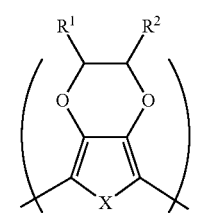
(1-2)

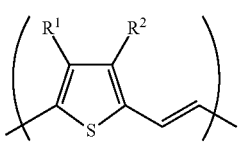
(1-3)

wherein "X" represents S, O, Se, Te, or NR⁵; R¹ and R² each independently represent any of a hydrogen atom, a hydroxy group, a halogen atom, and a linear, branched, or cyclic monovalent hydrocarbon group having 1 to 20 carbon atoms and optionally containing a heteroatom; R¹ and R² may be bonded to each other at any positions to form a ring; R⁵ represents a hydrogen atom, a linear or branched saturated or unsaturated alkyl group having 1 to 10 carbon atoms, or a substituted or unsubstituted aryl group having 6 to 10 carbon atoms; with the proviso that in the general formula (1-1), when "X" represents S, Se, or Te, or "X" represents NR⁵ and R⁵ represents a hydrogen atom, R¹ and R² do not both represent hydrogen atoms;

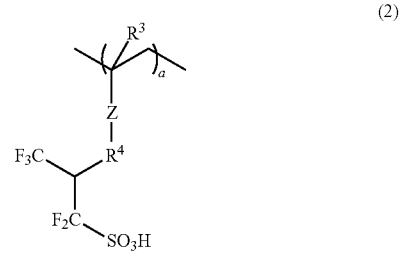
(2)

wherein R³ represents a hydrogen atom or a methyl group; R⁴ represents any of a single bond, an ester group, or a linear, branched, or cyclic hydrocarbon group having 1 to 12 carbon atoms and optionally containing either or both of an ether group and an ester group; "Z" represents any of a phenylene group, a naphtylene group, and an ester group; and "a" is 0<a≤1.0.

Such a conductive polymer composition has excellent antistatic performance in electron beam-resist drawing, good applicability onto a resist and peelability with H₂O and an aqueous alkaline solution, thereby being suitably used in electron beam lithography.

In this case, the repeating unit "a" in the component (B) preferably contains one or more repeating units selected from repeating units a1 to a6 shown by the following general formulae (2-1) to (2-6),

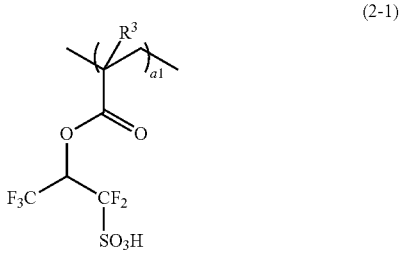
(2-1)

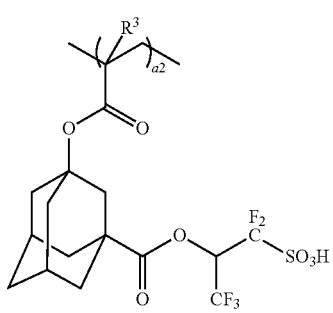
(2-2)

-continued

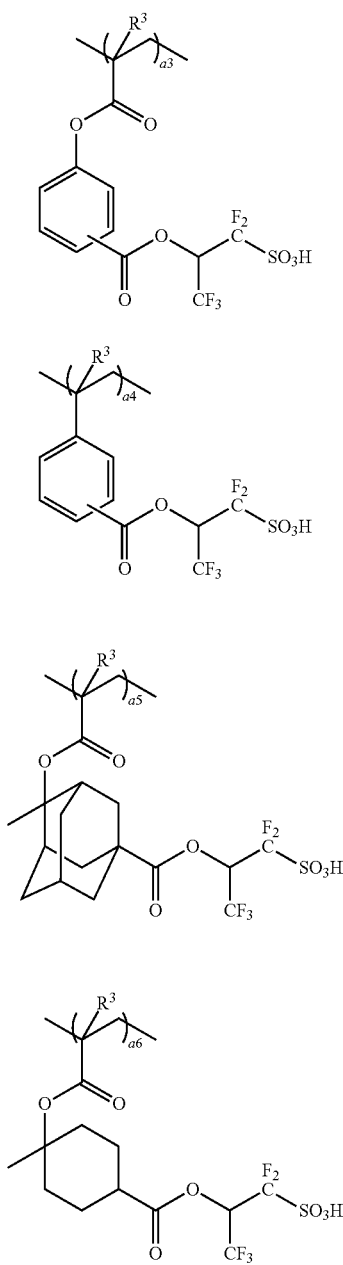

(2-3)

(2-4)

(2-5)

(2-6)

wherein $R^3$ has the same meaning as defined above; a1, a2, a3, a4, a5, and a6 are each $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, $0 \leq a6 \leq 1.0$, and $0 < a1+a2+a3+a4+a5+a6 \leq 1.0$.

Such a component (B) can be combined with the component (A) to form a composite, the dispersion of which has a good filterability and excellent film formability on an electron beam resist by spin coating, which can form an antistatic film with good flatness and conductivity in film forming, and the film formed from which has excellent peelability with $H_2O$ and an alkaline developer.

In this case, preferably, the component (B) further contains a repeating unit "b" shown by the following general formula (3),

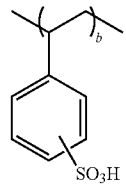

(3)

wherein "b" is $0 < b < 1.0$.

With containing such a repeating unit "b", it is possible to further improve the conductivity.

The conductive polymer composition can be used for forming an antistatic film.

The present invention also provide a coated article comprising an antistatic film formed by using the foregoing conductive polymer composition on a body to be processed.

The antistatic film formed from the inventive conductive polymer composition has excellent antistatic performance. Accordingly, it is possible to obtain coated articles with high quality by coating various bodies to be processed with such an antistatic film.

In this case, the body to be processed can be a substrate having a chemically amplified resist film.

The inventive conductive polymer composition can adapt to an independent step of peeling an antistatic film or a step of peeling an antistatic film involved in a developing step in an electron beam resist-drawing process. Accordingly, even a substrate having a chemically amplified resist film can be suitably used.

The present invention further provides a patterning process comprising the steps of: forming an antistatic film on a chemically amplified resist film of a substrate having the chemically amplified resist film by using the foregoing conductive polymer composition; irradiating in a pattern with electron beam; and developing with an alkaline developer to obtain a resist pattern.

By using such a patterning process, it is possible to prevent an electrification phenomenon during exposure and to obtain a pattern with high resolution and good pattern profile.

As described above, the inventive conductive polymer composition, which contains a composite formed from a π-conjugated conductive polymer of the component (A) and a super-acidic sulfo group-containing dopant polymer of the component (B), has a low viscosity and good filterability; exhibits excellent applicability, film formability, and flatness of a film on a substrate; and forms a film with low surface resistivity (Ω/□), thereby being able to form an antistatic film with good conductivity. Moreover, such a conductive polymer composition has excellent antistatic performance in electron beam-resist drawing, does not adversely affect a resist, and the film is easily peeled with $H_2O$ and an alkaline developer. Accordingly, it can be applied to an antistatic film of an electron beam resist to show an effect of suppressing a particle-originated defect due to the composition in a peeling step after the electron beam drawing.

The antistatic film formed from the inventive conductive polymer composition is excellent in antistatic performance. Accordingly, it is possible to obtain coated articles with high quality by coating various bodies to be processed with such an antistatic film.

By the inventive patterning process, it is possible to prevent an electrification phenomenon during exposure and to obtain a pattern with high resolution and good pattern profile.

DETAILED DESCRIPTION OF THE PREFERRED EMBODIMENTS

As described above, it has been required to develop a conductive polymer composition that has excellent antistatic performance in electron beam-resist drawing, good applicability onto a resist and peelability with $H_2O$ and an aqueous alkaline solution, thereby being suitably used in electron beam lithography.

The present inventors have intensively investigated to solve the above-described problems, and consequently found that when the following π-conjugated conductive polymer of the component (A) and the following super-acidic sulfo group-containing dopant polymer of the component (B) having a repeating unit which contains an α-fluorinated sulfo group instead of polystyrene sulfonic acid (PSS) widely used as a dopant for a conductive polymer material are used, the film formability is improved due to its good filterability, excellent applicability on a resist, excellent flatness of a film, low surface resistivity ($\Omega/\square$), and excellent antistatic performance are exhibited, and the peelability of a formed film with $H_2O$ and an alkaline developer is improved, thereby brought the present invention to completion.

That is, the present invention is a conductive polymer composition comprising:

(A) a π-conjugated conductive polymer having at least one repeating unit shown by the following general formulae (1-1), (1-2), and (1-3); and (B) a dopant polymer which contains a repeating unit "a" shown by the following general formula (2) and has a weight-average molecular weight in a range of 1,000 to 500,000;

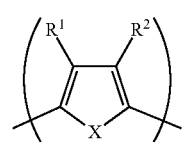

(1-1)

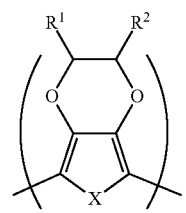

(1-2)

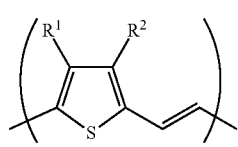

(1-3)

wherein "X" represents S, O, Se, Te, or $NR^5$; $R^1$ and $R^2$ each independently represent any of a hydrogen atom, a hydroxy group, a halogen atom, and a linear, branched, or cyclic monovalent hydrocarbon group having 1 to 20 carbon atoms and optionally containing a heteroatom; $R^1$ and $R^2$ may be bonded to each other at any positions to form a ring; $R^5$ represents a hydrogen atom, a linear or branched saturated or unsaturated alkyl group having 1 to 10 carbon atoms, or a substituted or unsubstituted aryl group having 6 to 10 carbon atoms; with the proviso that in the general formula (1-1), when "X" represents S, Se, or Te, or "X" represents $NR^5$ and $R^5$ represents a hydrogen atom, $R^1$ and $R^2$ do not both represent hydrogen atoms;

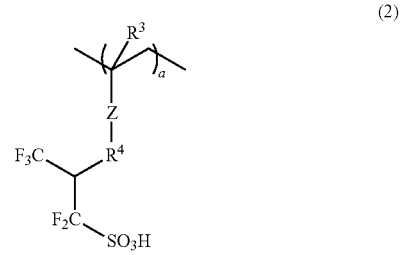

(2)

wherein $R^3$ represents a hydrogen atom or a methyl group; $R^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphtylene group, and an ester group; and "a" is $0<a\leq1.0$.

It is possible to obtain the inventive conductive polymer composition, which is suitably used for an antistatic film, by mixing the composite formed from a π-conjugated conductive polymer of the component (A) and a super-acidic sulfo group-containing dopant polymer of the component (B) with solvent, additionally with water-soluble polymer, surfactant, and so on depending on circumstances, followed by filtration thereof with a filter, etc., for example. In order to obtain the coated article comprising an antistatic film formed by using the foregoing conductive polymer composition, the patterning process using the foregoing conductive polymer composition, and the substrate obtained by the foregoing patterning process, it is possible to obtain them by forming an antistatic film, for example, by applying the inventive conductive polymer composition onto a substrate, heat treatment, irradiating with IR or UV, etc.

Hereinafter, the present invention will be described specifically, but the present invention is not limited thereto.

[(A) π-Conjugated Conductive Polymer]

The inventive conductive polymer composition contains a π-conjugated conductive polymer which has at least one repeating unit shown by the following general formulae (1-1), (1-2), and (1-3) as the component (A),

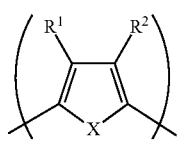

(1-1)

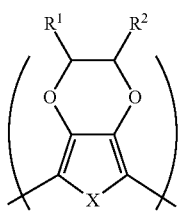

(1-2)

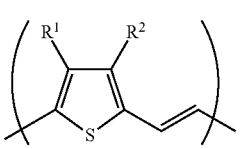

wherein "X" represents S, O, Se, Te, or NR$^5$; R$^1$ and R$^2$ each independently represent any of a hydrogen atom, a hydroxy group, a halogen atom, and a linear, branched, or cyclic monovalent hydrocarbon group having 1 to 20 carbon atoms and optionally containing a heteroatom; R$^1$ and R$^2$ may be bonded to each other at any positions to form a ring; R$^5$ represents a hydrogen atom, a linear or branched saturated or unsaturated alkyl group having 1 to 10 carbon atoms, or a substituted or unsubstituted aryl group having 6 to 10 carbon atoms; with the proviso that in the general formula (1-1), when "X" represents S, Se, or Te, or "X" represents NR$^5$ and R$^5$ represents a hydrogen atom, R$^1$ and R$^2$ do not both represent hydrogen atoms.

The component (A) may be a polymer obtained by polymerization of a precursor (an organic monomer molecule) of a heterocyclic compound containing a nitrogen atom or a chalcogen element, forming a π-conjugated chain (a structure of alternating a single bond and a double bond successively).

Illustrative examples of such a precursor monomer include pyrroles, furans, thiophenes, thiophenevinylenes, selenophenes, tellurophenes. Homopolymers or copolymers of these monomers can be used as the component (A).

Among the foregoing monomers, thiophenes and the derivatives thereof are particularly preferable in view of easy handling and polymerization, stability in the air, but not limited thereto.

The component (A) can obtain sufficient conductivity even when the π-conjugated conductive polymer is constituted of the unsubstituted monomer, however, it is also possible to use a monomer substituted with an alkyl group, a carboxy group, a sulfo group, an alkoxy group, a hydroxy group, a cyano group, halogen atoms in order to improve the conductivity.

Illustrative examples of such a monomer to form the π-conjugated conductive polymer include N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene.

Among them, a (co)polymer composed of one or two monomers selected from 3-methylthiophene, 3-methoxythiophene, and 3,4-ethylenedioxythiophene is suitably used in view of the resistivity and reactivity. Furthermore, the homopolymer of 3,4-ethylenedioxythiophene has high conductivity, and is more preferable.

The component (A) preferably contains a polymer obtained by polymerization of one or more precursor monomers to give a repeating unit shown by the foregoing general formulae (1-1) or (1-2), wherein "X" is S, O, Se, or Te. Such a monomer is easily polymerized and stable in the air, and accordingly the component (A) can be easily synthesized.

For practical reasons, the repeating number of these repeating units (precursor monomers) in the component (A) is preferably in a range of 2 to 20, more preferably in a range of 6 to 15.

The molecular weight of the component (A) is preferably about 130 to 5,000.

[(B) Dopant Polymer]

The inventive conductive polymer composition contains a dopant polymer as the component (B). This dopant polymer of the component (B) is a super-acidic polymer which contains a repeating unit "a" shown by the following general formula (2), containing a sulfonic acid in which α-position is fluorinated,

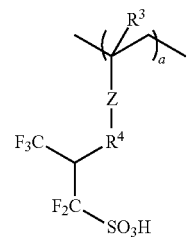

wherein R$^3$ represents a hydrogen atom or a methyl group; R$^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphtylene group, and an ester group; and "a" is 0<a≤1.0.

In the general formula (2), R$^3$ represents a hydrogen atom or a methyl group.

R$^4$ represents any of a single bond, an ester group, or a linear, branched, or cyclic hydrocarbon group having 1 to 12 carbon atoms and optionally containing either or both of an ether group and an ester group. Illustrative examples of the hydrocarbon group include an alkylene group, an arylene group, and an alkenylene group.

"Z" represents any of a phenylene group, a naphtylene group, and an ester group.

"a" is 0<a≤1.0, preferably 0.2≤a≤1.0.

The repeating unit "a" preferably contains one or more repeating units selected from repeating units a1 to a6 shown by the following general formulae (2-1) to (2-6), (2-1) 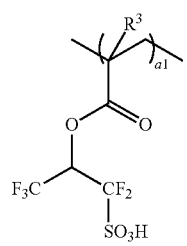

(2-2) 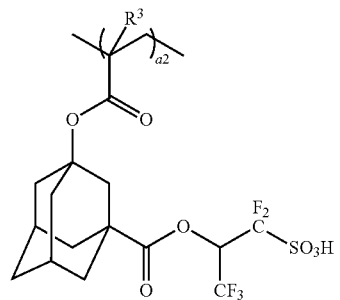

(2-3) 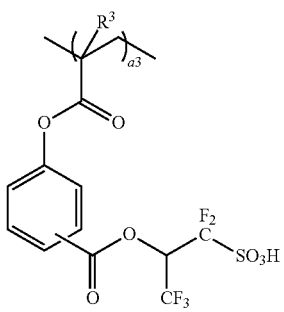

(2-4) 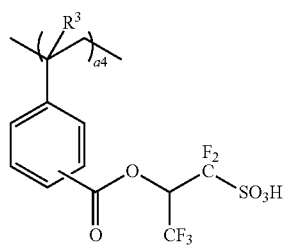

(2-5) 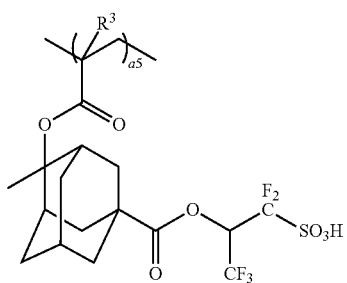

(2-6) 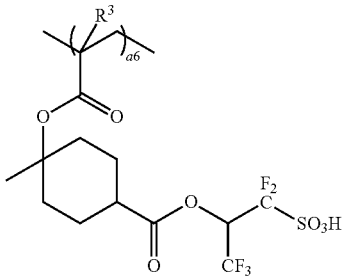

wherein $R^3$ has the same meaning as defined above; a1, a2, a3, a4, a5, and a6 are each $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, $0 \leq a6 \leq 1.0$, and $0 < a1+a2+a3+a4+a5+a6 \leq 1.0$.

Such a component (B) can be combined with the component (A) to form a composite, the dispersion of which has a good filterability and excellent film formability on an electron beam resist by spin coating, which can form an antistatic film with good flatness and conductivity in film forming, and the film formed from which has excellent peelability with $H_2O$ and an alkaline developer.

Illustrative examples of the monomer to give the repeating unit "a" include the following:

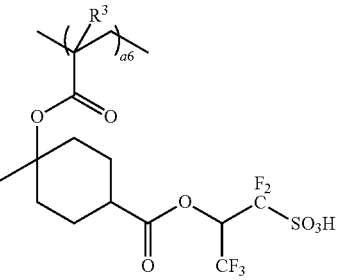

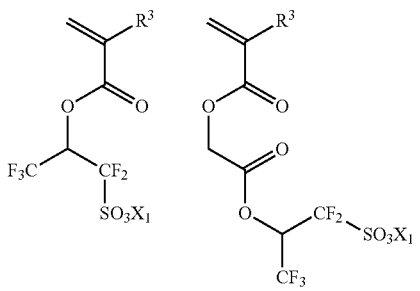

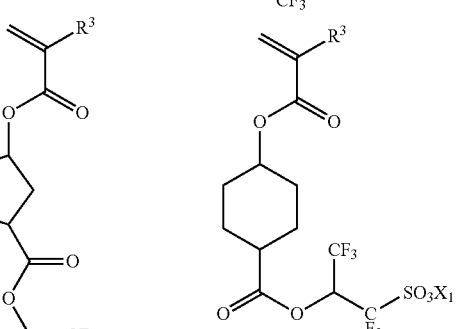

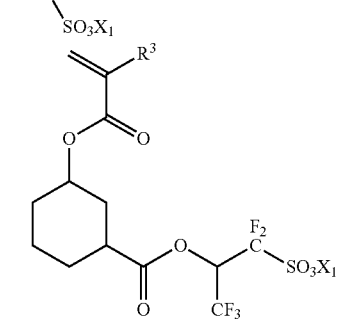

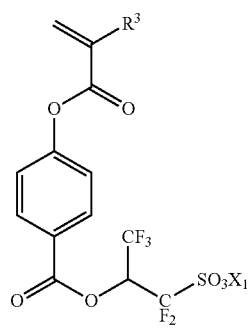
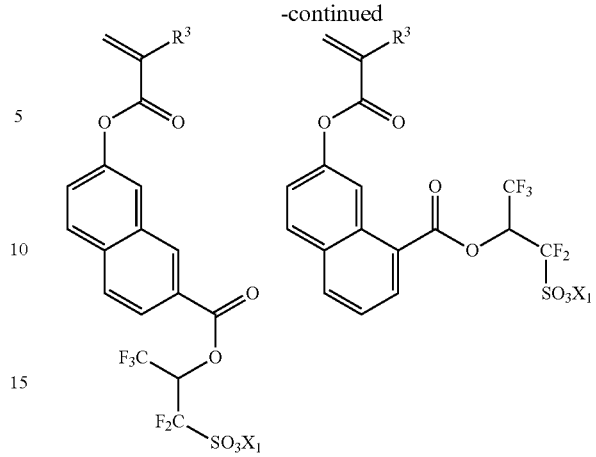
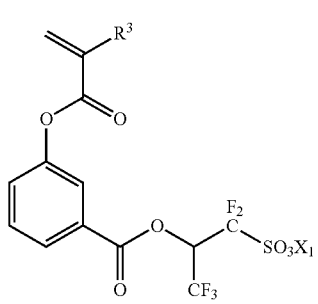
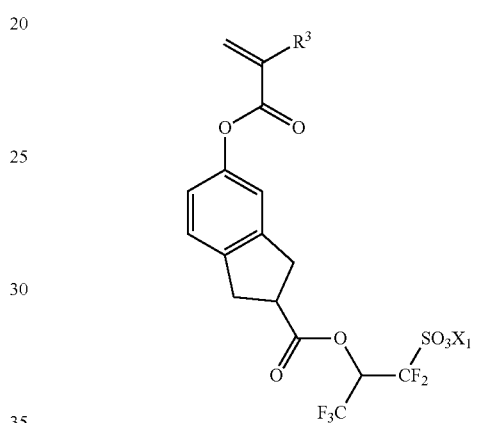
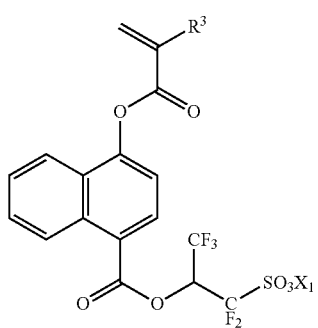
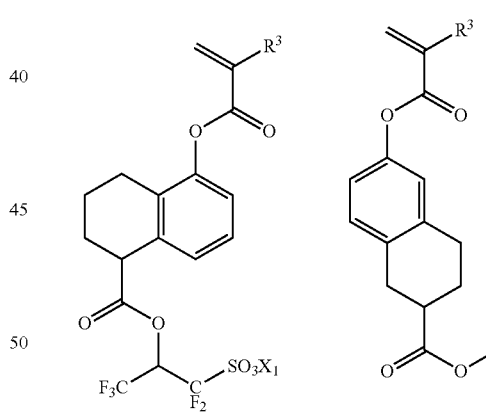
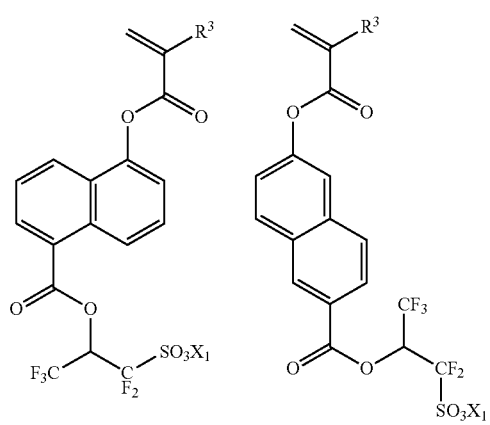
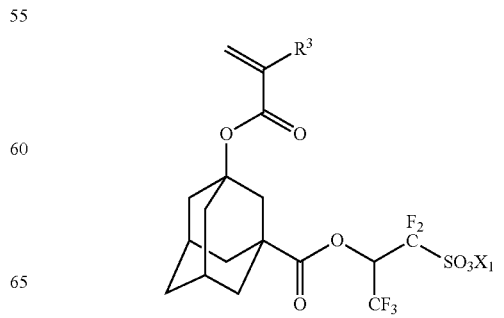

-continued
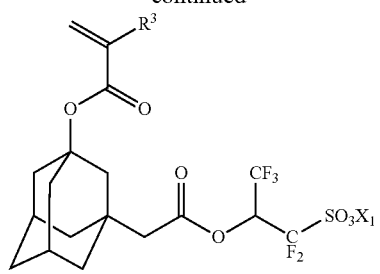
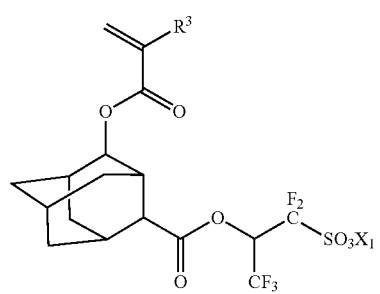
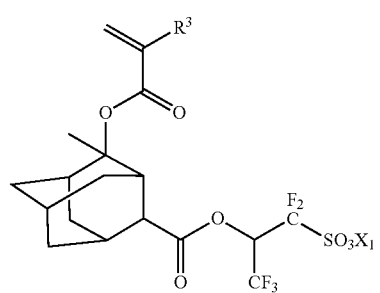
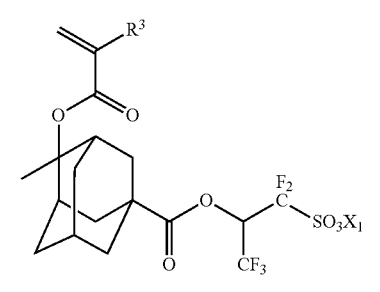
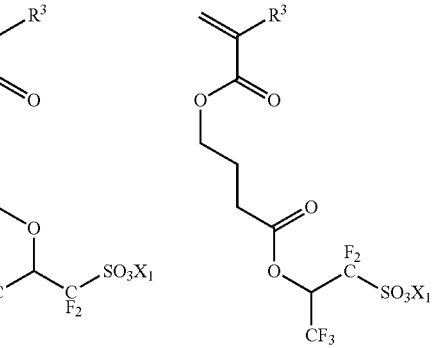
-continued
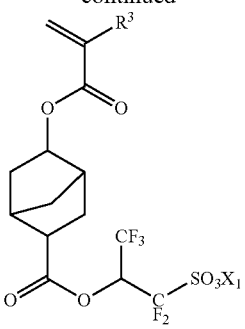
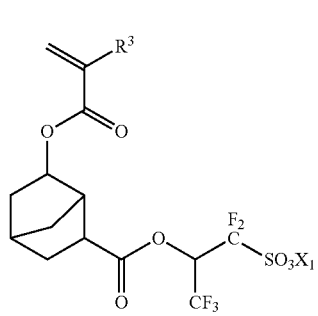
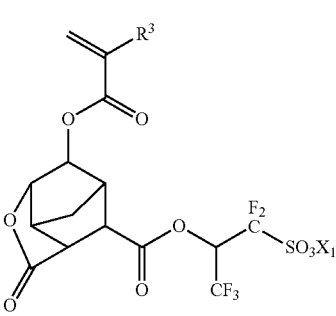
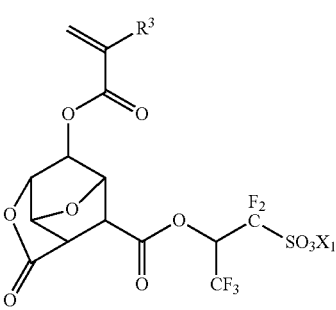
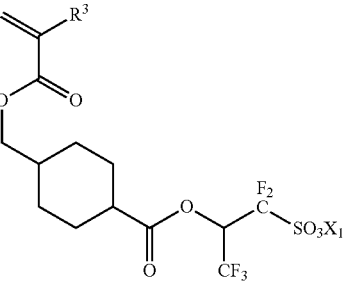

-continued
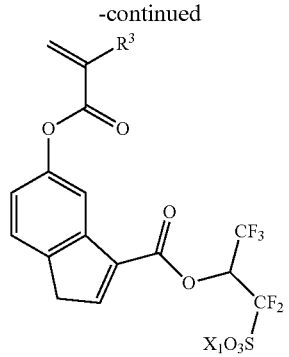
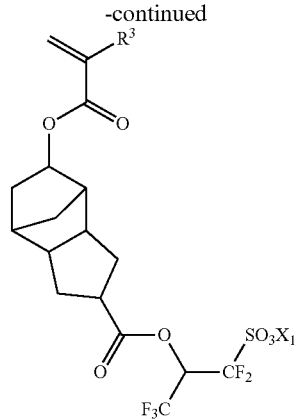
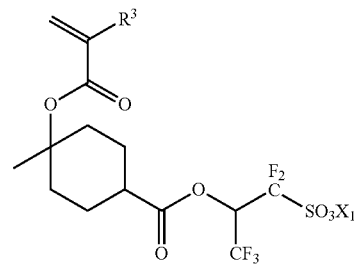
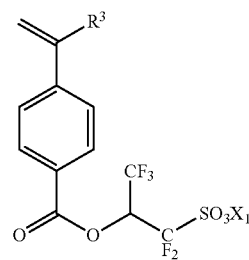
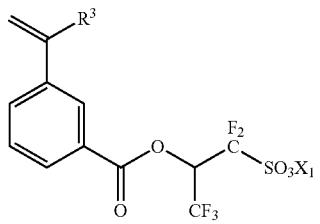
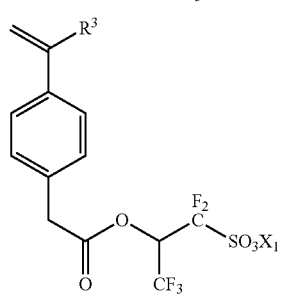
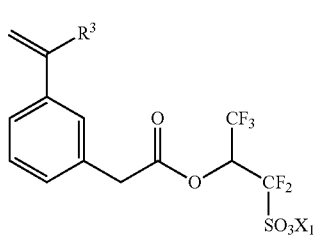

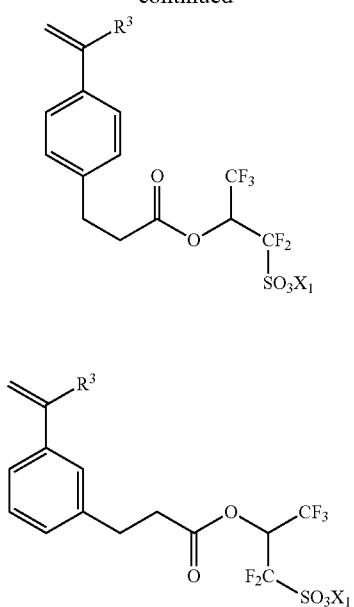

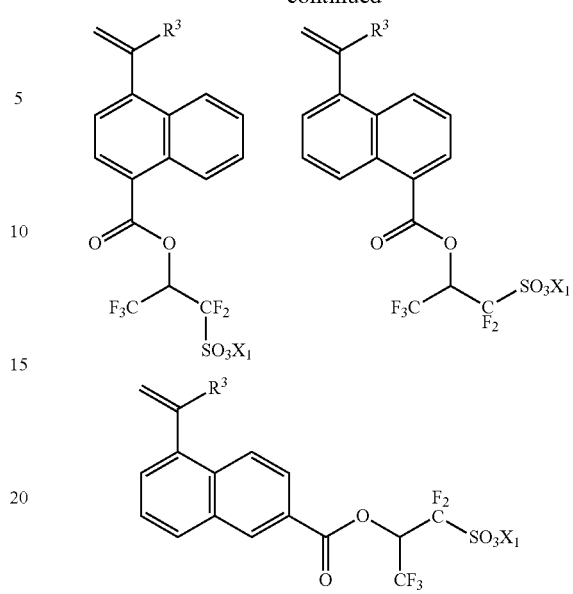

wherein $R^3$ has the same meaning as defined above; $X_1$ represents a hydrogen atom, a lithium atom, a sodium atom, a potassium atom, an amine compound, or a sulfonium compound.

Preferably, the component (B) further contains a repeating unit "b" shown by the following general formula (3). Containing such a repeating unit "b", the conductivity is further improved.

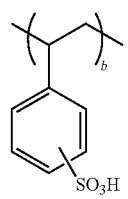

(3)

wherein "b" is 0<b<1.0.

Illustrative examples of the monomer to give the repeating unit "b" include the following:

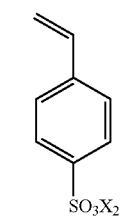

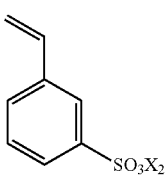

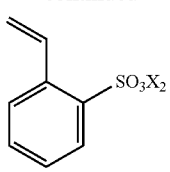

wherein $X_2$ represents a hydrogen atom, a lithium atom, a sodium atom, a potassium atom, an amine compound, or a sulfonium compound.

Illustrative examples of amine compounds as $X_1$ and $X_2$ include (Pla-3) described on paragraph [0048] in Japanese Patent Laid-Open Publication No. 2013-228447.

As described above, "a" is $0<a\leq1.0$, preferably $0.2\leq a\leq1.0$. Although the effect of the present invention can be obtained when $0<a\leq1.0$ (i.e. when the repeating unit "a" is contained), better effect can be obtained when $0.2\leq a\leq1.0$.

When the repeating unit "b" is contained, $0.3\leq b<1.0$ is preferable, and $0.3\leq b\leq0.8$ is more preferable in view of improving the conductivity.

The ratio of the repeating unit "a" and the repeating unit "b" is preferably $0.2\leq a\leq0.7$ and $0.3\leq b\leq0.8$, more preferably $0.3\leq a\leq0.6$ and $0.4\leq b\leq0.7$.

The dopant polymer of the component (B) can contain a repeating unit "c" other than the repeating unit "a" and the repeating unit "b", and illustrative examples of this repeating unit "c" include styrenes, vinylnaphthalenes, vinylsilanes, acenaphthylene, indene, vinylcarbazole.

Illustrative examples of a monomer to give the repeating unit "c" include the following.

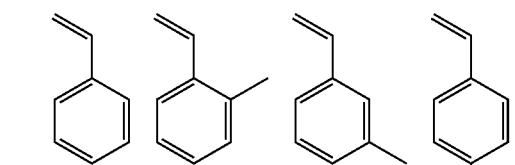
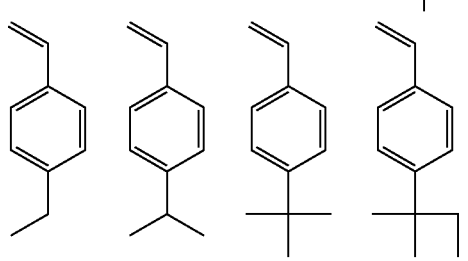
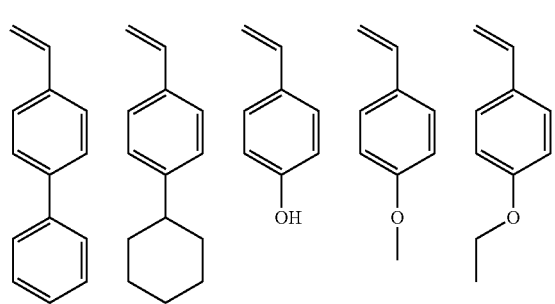
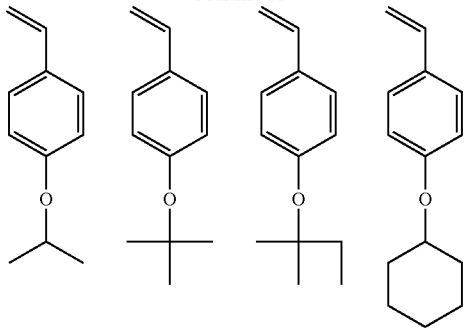
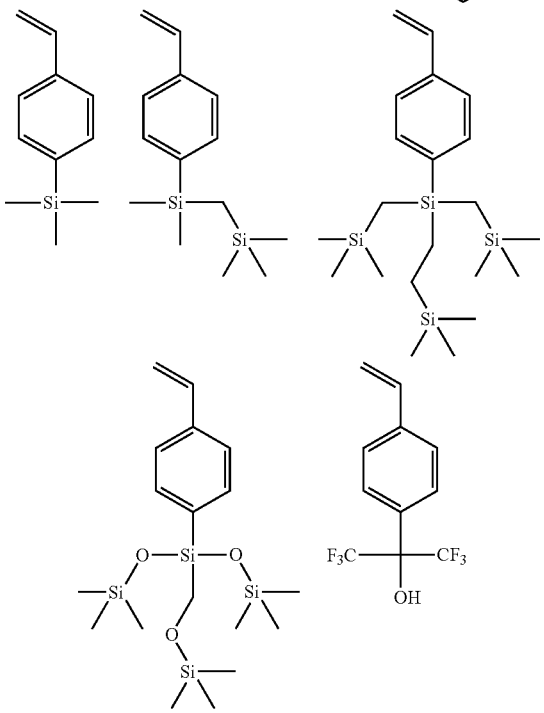
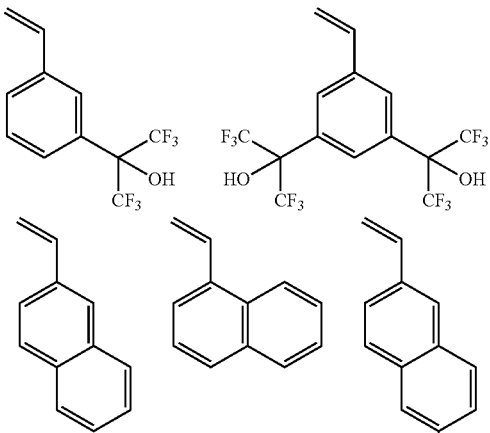
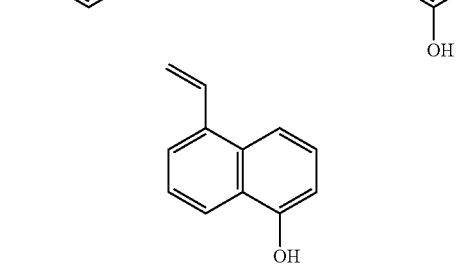

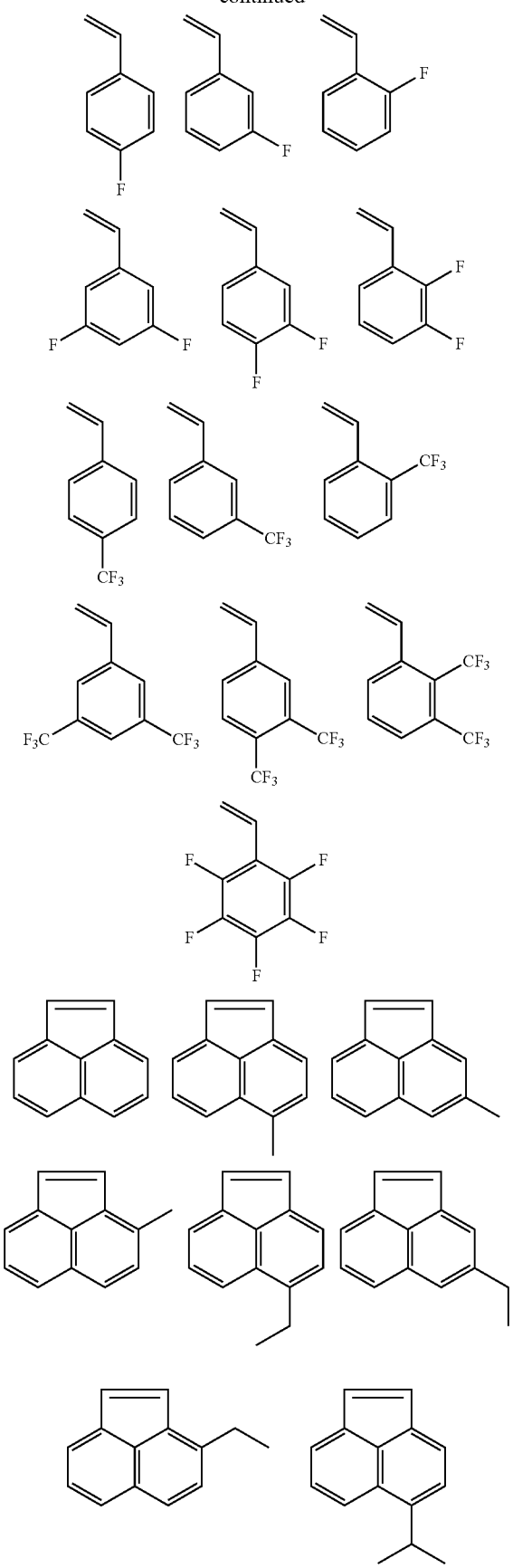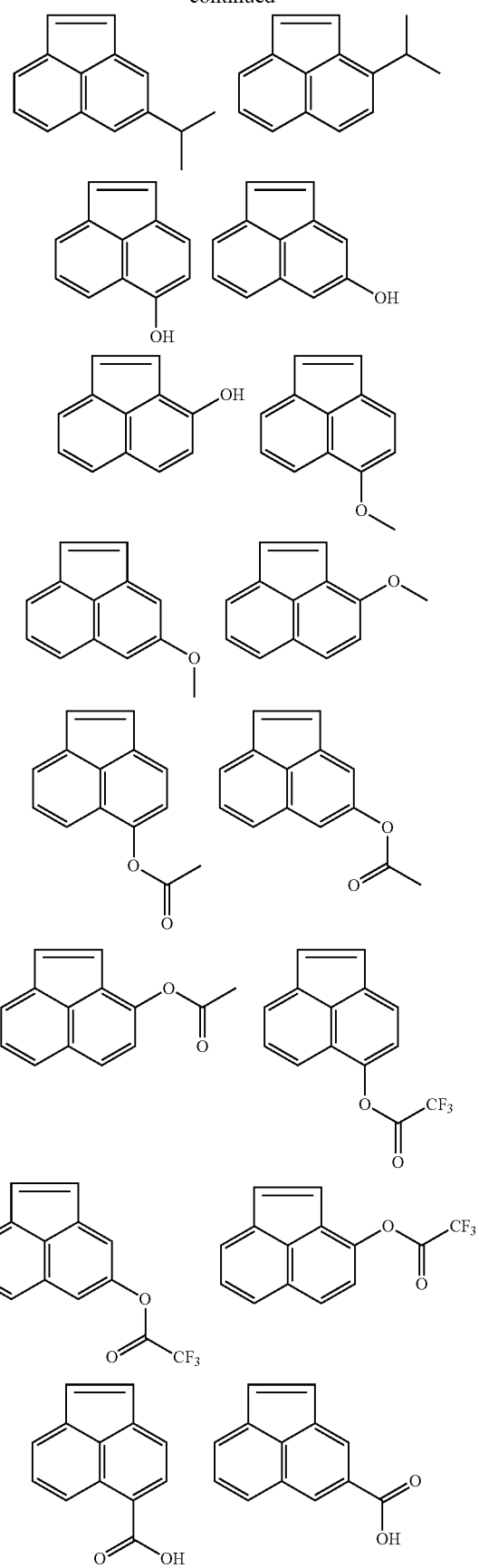

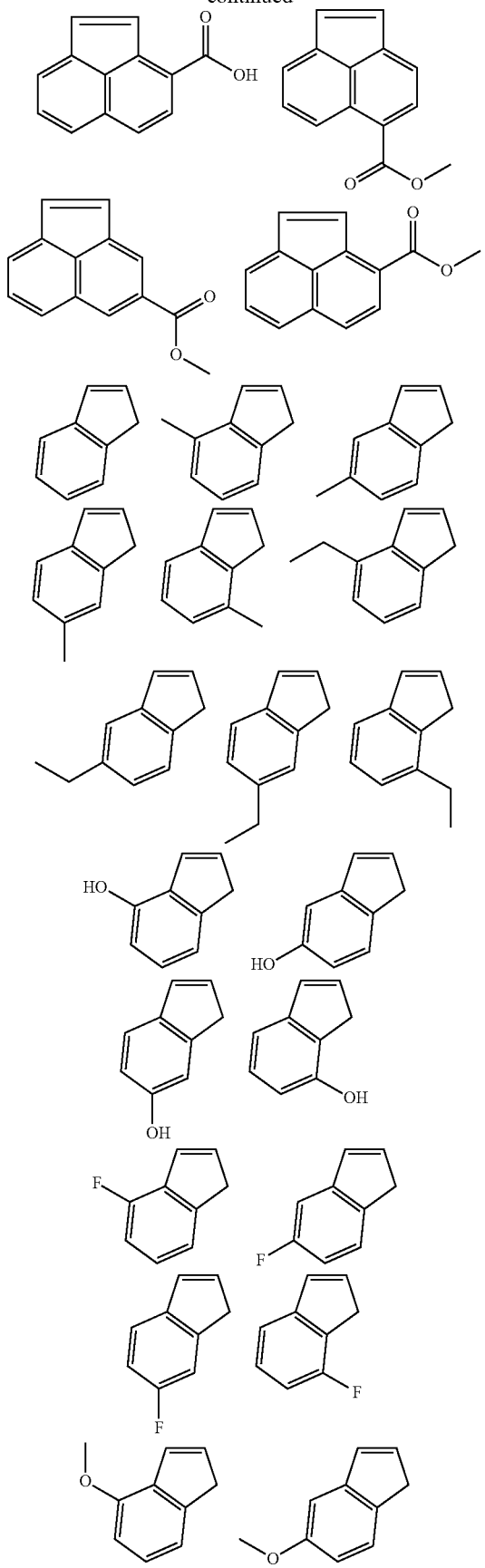
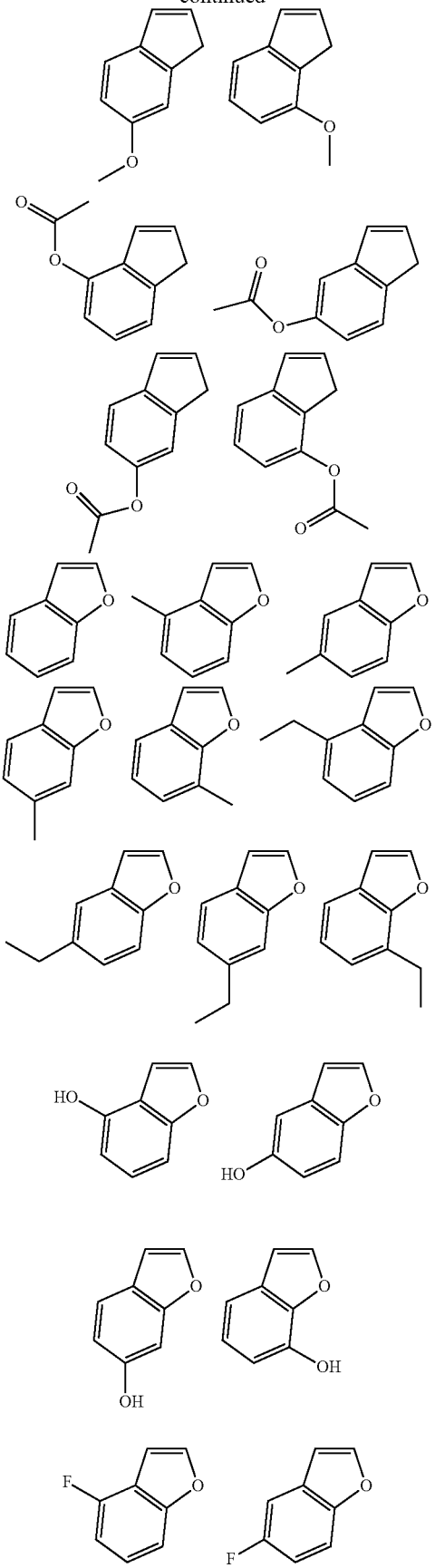

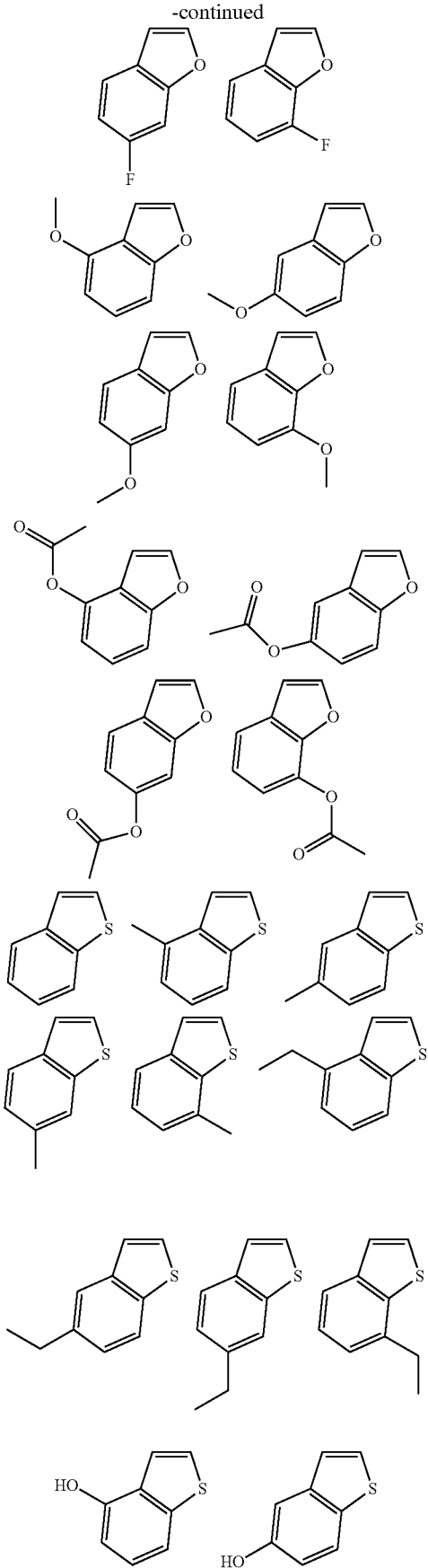

As a method for synthesizing the dopant polymer of the component (B), for example, a desired monomer(s) among the above monomers to give the repeating units "a" to "c" is/are subjected to heat polymerization by adding a radical polymerization initiator in an organic solvent to obtain a dopant polymer of a (co)polymer.

As the organic solvent to be used for the polymerization, there may be exemplified by toluene, benzene, tetrahydrofuran, diethyl ether, dioxane, cyclohexane, cyclopentane, methyl ethyl ketone, γ-butyrolactone, etc.

As the radical polymerization initiator, there may be exemplified by 2,2'-azobis(isobutyronitrile) (AIBN), 2,2'-azobis(2,4-dimethylvaleronitrile), dimethyl 2,2'-azobis(2-methylpropionate), benzoyl peroxide, lauroyl peroxide, etc.

The reaction temperature is preferably 50 to 80° C., and the reaction time is preferably 2 to 100 hours, more preferably 5 to 20 hours.

In the dopant polymer of the component (B), the monomer to give the repeating unit "a" may be one kind or a combination of two or more kinds, and it is preferred to combine a methacryl type monomer and a styrene type monomer to heighten polymerizability.

In addition, when using two or more kinds of monomers to give the repeating unit "a", each monomer can be copolymerized to a random copolymer or a block copolymer. When a block copolymerized polymer (block copolymer) is formed, it can be expected to obtain a merit that the conductivity is improved by aggregating the repeating unit portions comprising the two or more kinds of the repeating units "a" with each other to form a sea-island structure and to generate a peculiar structure around the dopant polymer.

Furthermore, each of the monomers to give the repeating units "a" to "c" can be copolymerized randomly or can be copolymerized as a block. In this case, it can be also expected to obtain a merit that the conductivity is improved by forming a block copolymer as in the foregoing case of the repeating unit "a".

When a random copolymerization is to be carried out by a radical polymerization, it is general to use the method in which the monomer(s) to be copolymerized and a radical polymerization initiator are mixed and polymerized by heating. In the case that the polymerization is started with a first monomer in the presence of a radical polymerization initiator, and then adding a second monomer thereto later, the resulting polymer has a structure in which one side of the polymer molecule is a structure that the first monomer is polymerized, and the other side is a structure that the second monomer is polymerized. However, in this case, the repeating units of the first monomer and the second monomer are mixedly present at the middle portion, which is different in the structure from the block copolymer. For forming the block copolymer by radical polymerization, the living radical polymerization is preferably used.

In a living radical polymerization method called RAFT polymerization (Reversible Addition Fragmentation chain Transfer polymerization), the radical at the polymer terminal is always living, so that it is possible to form a diblock copolymer comprising a block of a repeating unit of the first monomer and a block of a repeating unit of the second monomer by starting the polymerization with the first monomer, and then adding the second monomer at the stage when the first monomer has been consumed. In addition, it is also possible to form a triblock polymer by starting the polymerization with the first monomer, then adding the second monomer at the stage when the first monomer has been consumed, and then adding the third monomer thereto.

When the RAFT polymerization is carried out, there is a characteristic that a narrowly distributed polymer having a narrow molecular weight distribution (degree of distribution) is formed, in particular, when the RAFT polymerization is carried out by adding the monomers at once, a polymer having a narrower molecular weight distribution can be formed.

The dopant polymer of the component (B) preferably has a narrow distribution, and the molecular weight distribution (Mw/Mn) thereof is preferably 1.0 to 2.0, particularly preferably 1.0 to 1.5. If the dopant polymer has a narrow distribution, it is possible to prevent lowering of the permeability of an antistatic film formed from a conductive polymer composition using the dopant polymer.

To carry out the RAFT polymerization, a chain transfer agent is necessary, and specific examples thereof may be mentioned 2-cyano-2-propyl benzothioate, 4-cyano-4-(phenylcarbonothioylthio)pentanoic acid, 2-cyano-2-propyl dodecyltrithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl (phenyl) carbamothioate, bis(thiobenzoyl) disulfide, and bis(dodecylsulfanylthiocarbonyl) disulfide. Among these, 2-cyano-2-propyl benzothioate is particularly preferred.

The ratio of the repeating units "a", "b", and "c" is preferably $0<a\le1.0$, $0<b<1.0$, and $0\le c<1.0$; more preferably $0.1\le a\le0.9$, $0.1\le b\le0.9$, and $0\le c\le0.8$; further preferably $0.2\le a\le0.8$, $0.2\le b\le0.8$, and $0\le c\le0.5$.

It is to be noted that preferably, $a+b+c=1$.

The dopant polymer of the component (B) has a weight-average molecular weight in a range of 1,000 to 500,000, preferably in a range of 2,000 to 200,000. If the weight-average molecular weight is less than 1,000, the heat resistance gets worse, and the homogeneity of a composite solution with the component (A) becomes poor. On the other hand, if the weight-average molecular weight is more than 500,000, the conductivity deteriorates and the viscosity is increased to worsen the workability and to lower the dispersibility into water or an organic solvent.

It is to be noted that the weight-average molecular weight (Mw) is a value in terms of polyethylene oxide, polyethylene glycol, or polystyrene measured by gel permeation chromatography (GPC) using water, dimethylformamide (DMF), or tetrahydrofuran (THF) as a solvent.

As a monomer to constitute the dopant polymer of the component (B), it is possible to use a monomer having a sulfo group, but it is also possible to use a lithium salt, sodium salt, potassium salt, ammonium salt, or sulfonium salt of the sulfo group as a monomer to carry out the polymerization reaction, and then to change to a sulfo group with using an ion-exchange resin after the polymerization.

[Other Components]

(Surfactant)

In the present invention, a surfactant may be added to enhance the wettability to the body to be processed such as a substrate. As the surfactant, there may be mentioned various surfactants such as a nonionic type, a cationic type, an anionic type, etc., and nonionic surfactant is particularly preferable in view of stability of the conductive polymer. Illustrative examples thereof include nonionic surfactant, which is suitable, such as polyoxyethylene alkyl ether, polyoxyethylene alkyl phenyl ether, polyoxyethylene carboxylic acid ester, sorbitan ester, and polyoxyethylene sorbitan ester; cationic surfactant such as alkyltrimethylammonium chloride, alkylbenzylammonium chloride; anionic surfactant such as alkyl or alkylallyl sulfate salt, alkyl or alkylallyl sulfonate salt, and dialkyl sulfosuccinate salt; amphoteric surfactant such as amino acid type and betaine type. The blending amount of the surfactant is preferably 0.005 to 0.5% by mass, particularly 0.01 to 0.3% by mass.

(Conductivity-enhancing Agent)

In the present invention, the conductive polymer composition can contain an organic solvent as a conductivity-enhancing agent other than the main solvent in order to improve the conductivity of the conductive polymer composition as well as the applicability and film formability onto a resist surface or a substrate. Illustrative examples thereof include alcohols such as methanol, ethanol, propanol, and butanol; aliphatic polyvalent alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, 1,3,5-adamantanetriol, 1,2,3-butanetriol, 1,2,4-butanetriol, 1,2,3-cyclohexanetriol, 1,3,5-cyclohexanetriol, neopentyl glycol, and polyethylene glycol; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; cyclic ethers such as dioxane and tetrahydrofuran; polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, N-methyl-2-pyrrolidone, N,N'-dimethylformamide, dimethyl sulfoxide, N,N-dimethylacetamide, sulfolane, and hexamethylenephosphor triamide; carbonate compounds such as ethylene carbonate and propylene carbonate; heterocyclic compounds such as 3-methyl-2-oxazolidinone; nitrile compounds such as acetonitrile, glutaronitrile, methoxyacetonitrile, propionitrile, and benzonitrile; and mixtures thereof. The contents of the solvent is preferably 0.1 to 10.0% by mass, particularly 3.0 to 6.0% by mass. These solvents may be added to the conductive polymer composition prior to the polymerization or subsequent to the polymerization.

<Conductive Polymer Composition>

The inventive conductive polymer composition contains the π-conjugated conductive polymer of the component (A) and the dopant polymer of the component (B) described above, and the dopant polymer of the component (B) forms a composite (conductive polymer composite) through ionic bond to the π-conjugated conductive polymer of the component (A).

The inventive conductive polymer composition preferably has a dispersibility into water or an organic solvent, and can improve the film formability onto an inorganic or organic substrate (a substrate on which an inorganic film or an organic film is formed onto the surface) by spin coating and flatness of the film.

(Production Method of Conductive Polymer Composition)

The composite of the component (A) and the component (B) (conductive polymer composite) can be obtained by, for example, adding monomer(s) of the raw material(s) of the component (A) (preferably, thiophenes or derivatives thereof) to an aqueous solution or water/organic solvent mixture solution of the component (B), and adding an oxidizing agent and an oxidation catalyst depending on circumstances to perform an oxidative polymerization.

Illustrative examples of the oxidizing agent and the oxidation catalyst include peroxodisulfate salts (persulfate salts) such as ammonium peroxodisulfate (ammonium persulfate), sodium peroxodisulfate (sodium persulfate), and potassium peroxodisulfate (potassium persulfate); transition metal compounds such as ferric chloride, ferric sulfate, and cupric chloride; metal oxides such as silver oxide and cesium oxide; peroxides such as hydrogen peroxide and ozone; organic peroxides such as benzoyl peroxide; and oxygen.

As the reaction solvent to be used for the oxidative polymerization, water or a mixture of water and a solvent may be used. As the solvent to be used here is preferably miscible with water and can dissolve or disperse the component (A) and the component (B). Illustrative examples thereof include alcohols such as methanol, ethanol, propanol, and butanol; polyvalent aliphatic alcohols such as ethylene glycol, propylene glycol, 1,3-propanediol, dipropylene glycol, 1,3-butylene glycol, 1,4-butylene glycol, D-glucose, D-glucitol, isoprene glycol, 1,2-butanediol, 1,3-butanediol, 1,4-butanediol, 2,3-butanediol, 1,2-pentanediol, 1,5-pentanediol, 1,2-hexanediol, 1,6-hexanediol, 1,9-nonanediol, and neopentyl glycol; chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether; cyclic ether compounds such as dioxane and tetrahydrofuran; polar solvents such as cyclohexanone, methyl amyl ketone, ethyl acetate, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, N-methyl-2-pyrrolidone, N,N'-dimethylformamide, N,N'-dimethylacetamide, dimethyl sulfoxide, and hexamethylenephosphor triamide; carbonate compounds such as ethylene carbonate and propylene carbonate; heterocyclic compounds such as 3-methyl-2-oxazolidinone; and nitrile compounds such as acetonitrile, glutaronitrile, methoxyacetonitrile, propionitrile, and benzonitrile. These solvents may be used singly or as a mixture of two or more of them. The blending amount of these water-miscible solvents is preferably 50% by mass or less with respect to entirety of the reaction solvents.

Note that the usage amount of the water-miscible solvent (organic solvent) is preferably to be 0 to 1,000 mL, particularly preferably 0 to 500 mL, relative to 1 mole of monomers. If the usage amount of the organic solvent is 1,000 mL or less, it is economical because the reaction vessel may not become too much.

Besides the dopant polymer of the component (B), another anion capable of being doped into the π-conjugated conductive polymer of the component (A) may be used. As to the anion like this, an organic acid is preferable in view of controlling the characteristic of de-doping from the π-conjugated conductive polymer, as well as dispersibility, heat resistance, and environment resistance of the conductive polymer composition. As the organic acid, there may be mentioned an organic carboxylic acid, phenols, an organic sulfonic acid, etc.

As to the organic carboxylic acid, acids of aliphatic, aromatic, or alicyclic compound having one, or two or more carboxy groups may be used. Illustrative examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid.

Illustrative example of the phenols includes cresol, phenol, and xylenol.

As to the organic sulfonic acid, aliphatic, aromatic, or alicyclic sulfonic acid having one, or two or more sulfo groups may be used. Illustrative examples of the compound having one sulfo group include methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, tri fluoromethanesulfonic acid, colistinmethanesulfonic acid, 2-acrylamide-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluenesulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-acetamide-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalenesulfonic acid, pentylnaphthalenesulfonic acid, dimethylnaphthalenesulfonic acid, 4-amino-1-naphthalenesulfonic acid, 8-chloronaphthalene-1-sulfonic acid, polycondensation product of naphthalenesulfonic acid and formalin, and polycondensation product of melaminesulfonic acid and formalin.

Illustrative examples of the compound containing two or more sulfo groups include ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, 4-amino-5-naphthol-2,7-disulfonic acid, anthracene disulfonic acid, butylanthracene disulfonic acid, 4-acetamide-4'-isothiocyanatostilbene-2,2'-disulfonic acid, 4-acetamide-4'-isothiocyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6-naphthalene trisulfonic acid, 8-aminonaphthalene-1,3,6-trisulfonic acid, and 3-amino-1,5,7-naphthalene trisulfonic acid.

These anions other than the component (B) may be added into a solution containing a raw material monomer of the component (A), the component (B), and an oxidizing agent and/or an oxidative polymerization catalyst before polymerization of the component (A). Alternatively, it may be added into the conductive polymer composite (solution) which contains the component (A) and the component (B) after the polymerization.

The composite of the component (A) and the component (B) thus obtained may be used after being pulverized by a homogenizer, a ball mill, or the like, if necessary.

For pulverization, a mixer/disperser which can apply a high shear force is preferably used. Illustrative examples of the mixer/disperser include a homogenizer, a high-pressure homogenizer, and a bead mill; among them, a high-pressure homogenizer is particularly preferable.

Illustrative examples of the high-pressure homogenizer include NanoVater (manufactured by Yoshida Kikai Co., Ltd.), Microfluidizer (manufactured by Powrex Corp.), and Ultimizer (manufactured by Sugino Machine Ltd.).

As the dispersion treatment using the high-pressure homogenizer, there may be mentioned a treatment in which the composite solutions before the dispersion treatment are collided from the opposite direction with each other under high pressure, or a treatment in which the solution is passed through an orifice or a slit under high pressure.

Before or after the pulverization, impurities may be removed by the measures such as filtration, ultrafiltration, and dialysis; and also, purification may be done by using a cation-exchange resin, an anion-exchange resin, a chelate resin, or the like.

The total content of the component (A) and the component (B) in the conductive polymer composition solution is preferably in the range of 0.05 to 5.0% by mass. If the total content of the component (A) and the component (B) is 0.05% by mass or more, sufficient conductivity can be obtained; and if it is 5.0% by mass or less, the uniform conductive coating film can be readily obtained.

The content of the component (B) is preferably such an amount that the sulfo group in the component (B) is in the range of 0.1 to 10 mole, more preferably 1 to 7 mole, per 1 mole of the component (A). If the content of the sulfo group in the component (B) is 0.1 mole or more, the doping effect to the component (A) is so high that sufficient conductivity can be secured. On the other hand, if the content of the sulfo group in the component (B) is 10 mole or less, the content of the component (A) also becomes appropriate, so that sufficient conductivity can be obtained.

The conductive polymer composition thus obtained can form an antistatic film by applying it onto a body to be processed such as an electron beam resist or a substrate. Illustrative examples of the method of applying the conductive polymer composition include coating by a spin coater, a bar coater, soaking, comma coating, spray coating, roll coating, screen printing, flexographic printing, gravure printing, and ink jet printing. After applying, heat treatment by using a hot-air circulating furnace, a hot plate, or the like, or irradiation with IR light, UV light, or the like may be carried out, whereby the antistatic film can be formed.

The inventive conductive polymer composition explained above has good filterability and applicability as well as excellent film formability on an electron beam resist by spin coating, realizes good flatness in film forming, and can form an antistatic film to show high conductivity and an efficient antistatic property.

Illustrative examples of the body to be processed include a glass substrate, a quartz substrate, a photomask blank substrate, a resin substrate, a silicon wafer, compound semiconductor wafers such as a gallium arsenic wafer and an indium phosphorous wafer.

The present invention also provides a coated article having an antistatic film formed thereon by using the inventive conductive polymer composition. Illustrative examples of such a coated article include a glass substrate having an antistatic film, a resin film having an antistatic film, and a resist substrate having an antistatic film.

Particularly, the inventive conductive polymer composition can adapt to an independent step of peeling an antistatic film or a step of peeling an antistatic film involved in a developing step in an electron beam resist-drawing process. Accordingly, even a substrate having a chemically amplified resist film can be suitably used.

That is, the present invention provides a patterning process including the steps of: forming an antistatic film on a chemically amplified resist film of a substrate having the chemically amplified resist film by using the inventive conductive polymer composition, irradiating in a pattern with electron beam, and developing with an alkaline developer to obtain a resist pattern.

The patterning process can be performed in accordance with a conventional method except that the inventive conductive polymer composition is used, and the antistatic film formed from the inventive conductive polymer composition can be peeled with $H_2O$ before the heating treatment and after the electron beam drawing or can be removed with a developer in a developing step of a resist pattern after the heating treatment. Naturally, other various steps such as an etching process can be performed after the development of a resist pattern.

According to such a patterning process, electrification phenomenon during exposure can be prevented, and a pattern having high sensitivity, high resolution, and good pattern profile can be obtained.

In the present invention, it is possible to obtain a substrate that has a resist pattern prepared by the above-mentioned patterning process.

The present invention is designed to be used for lithography using electron beam or the like, however, it can be also suitably used in lithography using ultraviolet light, or for preventing electrification of a film and glass because of excellent antistatic performance thereof.

EXAMPLES

Hereinafter, the present invention will be specifically described with reference to Synthesis Examples, Comparative Synthesis Examples, Examples, and Comparative Examples, but the present invention is not restricted thereto.

In the following, Dopant polymers 1 to 8 used in the Synthesis Examples are shown.

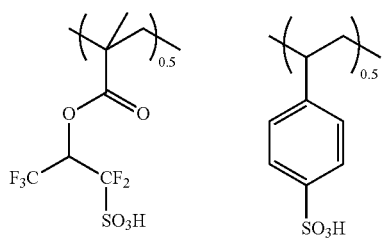

Dopant polymer 1

Weight-average molecular weight (Mw)=29,900
Molecular weight distribution (Mw/Mn)=1.91

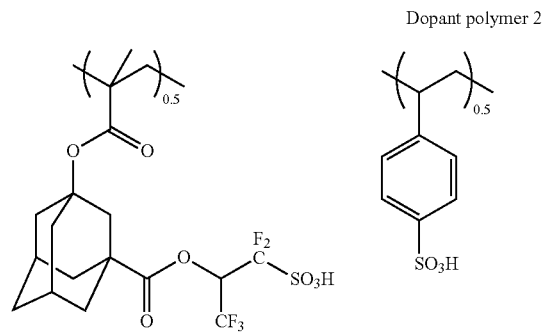

Dopant polymer 2

Weight-average molecular weight (Mw)=43,000
Molecular weight distribution (Mw/Mn)=1.77

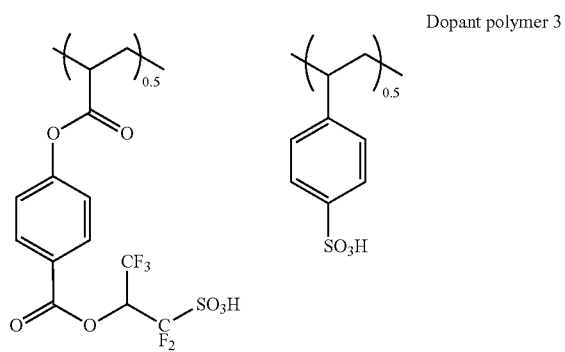

Dopant polymer 3

Weight-average molecular weight (Mw)=39,000
Molecular weight distribution (Mw/Mn)=1.81

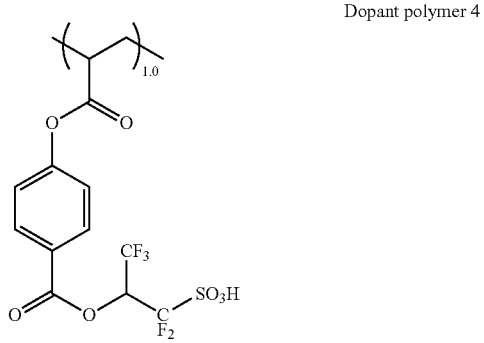

Dopant polymer 4

Weight-average molecular weight (Mw)=24,400
Molecular weight distribution (Mw/Mn)=1.94

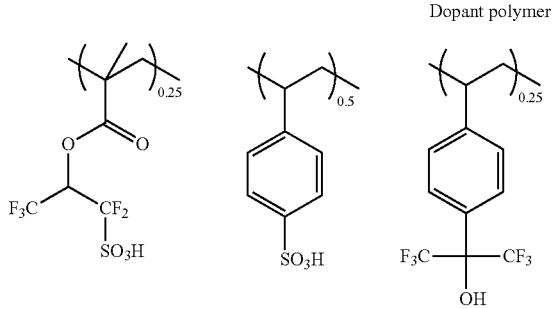

Dopant polymer 5

Weight-average molecular weight (Mw)=29,900
Molecular weight distribution (Mw/Mn)=1.91

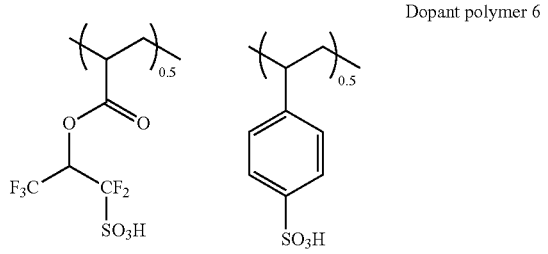

Dopant polymer 6

Weight-average molecular weight (Mw)=28,700
Molecular weight distribution (Mw/Mn)=1.58

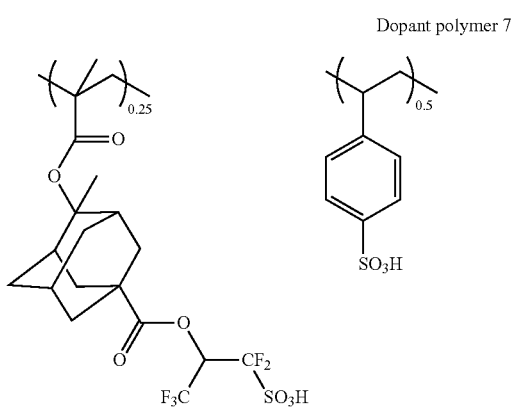

Dopant polymer 7

Weight-average molecular weight (Mw)=45,100
Molecular weight distribution (Mw/Mn)=1.93

Dopant polymer 8

Weight-average molecular weight (Mw)=48,300
Molecular weight distribution (Mw/Mn)=1.98

[Synthesis of Composite of π-Conjugated Conductive Polymer and Dopant Polymer]

Synthesis Example 1

The solution of 15.0 g of Dopant polymer 1 dissolved in 1,000 mL of ultrapure water and 3.82 g of 3,4-ethylenedioxythiophene were mixed at 30° C.

Into the obtained mixed solution, an oxidation catalyst solution of 8.40 g of sodium persulfate and 2.3 g of ferric sulfate dissolved in 100 mL of ultrapure water was slowly added while stirring the mixed solution and keeping the temperature thereof at 30° C., and the reaction was carried out for 4 hours under stirring.

To the reaction solution thus obtained, 1,000 mL of ultrapure water was added, and about 1,000 mL of the solution was removed by ultrafiltration. This procedure was repeated 3 times.

Subsequently, 200 mL of sulfuric acid diluted to 10% by mass and 2,000 mL of ion-exchanged water were added to the solution treated with the ultrafiltration, and about 2,000 mL of the treated solution was removed by ultrafiltration. After 2,000 mL of ion-exchanged water was added thereto, about 2,000 mL of the solution was removed again by ultrafiltration. This procedure was repeated 3 times.

The obtained treated solution was purified with cation-exchange resin and anion-exchange resin, and then 2,000 mL of ion-exchanged water was added, and about 2,000 mL of the treated solution was removed by ultrafiltration. This procedure was repeated 5 times to obtain Conductive polymer composite dispersion 1 having a blue color with a concentration of 1.3% by mass.

Conditions of the ultrafiltration were as follows.
Cut-off molecular weight of the ultrafiltration membrane: 30 K
Cross-flow method
Flow rate of the supply solution: 3,000 mL/min
Partial membrane pressure: 0.12 Pa Meanwhile, also in other Synthesis Examples, the ultrafiltration was carried out with the same conditions.

Synthesis Example 2

The same synthesis procedure as in Synthesis Example 1 was carried out, except that Dopant polymer 1 in Synthesis Example 1 was changed to Dopant polymer 2, the blending amount of 3,4-ethylenedioxythiophene was changed to 2.73 g, the blending amount of sodium persulfate was changed to 6.01 g, and the blending amount of ferric sulfate was changed to 1.64 g to obtain Conductive polymer composite dispersion 2.

Synthesis Example 3

The same synthesis procedure as in Synthesis Example 1 was carried out, except that Dopant polymer 1 in Synthesis Example 1 was changed to Dopant polymer 3, the blending amount of 3,4-ethylenedioxythiophene was changed to 3.38 g, the blending amount of sodium persulfate was changed to 7.44 g, and the blending amount of ferric sulfate was changed to 2.03 g to obtain Conductive polymer composite dispersion 3.

Synthesis Example 4

The same synthesis procedure as in Synthesis Example 1 was carried out, except that Dopant polymer 1 in Synthesis Example 1 was changed to Dopant polymer 4, the blending amount of 3,4-ethylenedioxythiophene was changed to 2.56 g, the blending amount of sodium persulfate was changed to 5.63 g, and the blending amount of ferric sulfate was changed to 1.53 g to obtain Conductive polymer composite dispersion 4.

Synthesis Example 5

The same synthesis procedure as in Synthesis Example 1 was carried out, except that Dopant polymer 1 in Synthesis Example 1 was changed to Dopant polymer 5, the blending amount of 3,4-ethylenedioxythiophene was changed to 4.77 g, the blending amount of sodium persulfate was changed to 10.49 g, and the blending amount of ferric sulfate was changed to 2.86 g to obtain Conductive polymer composite dispersion 5.

Synthesis Example 6

The same synthesis procedure as in Synthesis Example 1 was carried out, except that Dopant polymer 1 in Synthesis Example 1 was changed to Dopant polymer 6, the blending amount of 3,4-ethylenedioxythiophene was changed to 3.93 g, the blending amount of sodium persulfate was changed to 8.65 g, and the blending amount of ferric sulfate was changed to 2.36 g to obtain Conductive polymer composite dispersion 6.

Synthesis Example 7

The same synthesis procedure as in Synthesis Example 1 was carried out, except that Dopant polymer 1 in Synthesis Example 1 was changed to Dopant polymer 7, the blending amount of 3,4-ethylenedioxythiophene was changed to 2.73 g, the blending amount of sodium persulfate was changed to 6.01 g, and the blending amount of ferric sulfate was changed to 1.64 g to obtain Conductive polymer composite dispersion 7.

Synthesis Example 8

The same synthesis procedure as in Synthesis Example 1 was carried out, except that Dopant polymer 1 in Synthesis Example 1 was changed to Dopant polymer 8, the blending amount of 3,4-ethylenedioxythiophene was changed to 2.96 g, the blending amount of sodium persulfate was changed to 6.51 g, and the blending amount of ferric sulfate was changed to 1.78 g to obtain Conductive polymer composite dispersion 8.

Comparative Synthesis Example 1

The solution in which 83.3 g of an aqueous polystyrene sulfonic acid solution (concentration of 18.0% by mass, manufactured by Aldrich Co., Ltd.) had been diluted with 250 mL of ion-exchanged water were mixed with 5.0 g of 3,4-ethylenedioxythiophene at 30° C. Except that, the same synthesis procedure as in Synthesis Example 1 was carried out to obtain Conductive polymer composite dispersion 9 (PEDOT-PSS Dispersion) having a blue color with a concentration of 1.3% by mass.

Comparative Synthesis Example 2

The solution of 41.1 g of an aqueous polystyrene sulfonic acid solution (concentration of 18.0% by mass, manufactured by Aldrich Co., Ltd.) dissolved in 1,000 mL of ultrapure water were mixed with 27.5 g of 2-methoxyaniline at 25° C. To the mixed solution, a solution of 45.8 g of ammonium persulfate dissolved in 200 mL of ultrapure water was slowly added while stirring the mixed solution and keeping the temperature thereof at 0° C. to carry out the reaction. The obtained reaction solution was concentrated and added dropwise to 4,000 mL of acetone to give green powder. This green powder was dispersed to 1,000 mL of ultrapure water again, and added dropwise to 4,000 mL of acetone to purify and re-crystallize the green powder. This procedure was repeated 3 times, and the obtained green powder was dispersed to 2,000 mL of ultrapure water again, and about 1,000 mL of water was removed by ultrafiltration. This procedure was repeated 10 times to obtain a conductive polymer composite dispersion. This dispersion was added dropwise to 4,000 mL of acetone to give purified green powder (Conductive polymer composite 10).

Examples

Each 20.0 g of Conductive polymer composite dispersions 1 to 8 with a concentration of 1.3% by mass obtained by Synthesis Examples 1 to 8, 0.62 g of dimethyl sulfoxide, and 0.030 g of fluoroalkyl-nonionic surfactant FS-31 (manufactured by E. I. du Pont de Nemours and Company) were mixed. Then, this was filtrated by using a regenerated cellulose filter having a pore diameter of 3.0 μm (manufactured by Advantec MFS, Inc.) to prepare a conductive polymer composition, and the respective compositions were designated as Examples 1 to 8.

Comparative Examples

As Comparative Example 1, a conductive polymer composition was prepared in the same manner as Examples 1 to 8 except that Conductive polymer composite dispersion 9 (PEDOT-PSS Dispersion) obtained in Comparative Synthesis Example 1 was used.

To a dispersion with a concentration of 3.15% by mass in which 3.0 g of Conductive polymer composite (powder) 10 obtained in Comparative Synthesis Example 2 had been dispersed to 92.12 g of ultrapure water, 0.14 g of fluoroalkyl-nonionic surfactant FS-31 (manufactured by E. I. du Pont de Nemours and Company) was added. Then, this was filtrated by using a regenerated cellulose filter having a pore diameter of 3.0 μm (manufactured by Advantec MFS, Inc.)

to prepare a conductive polymer composition, and designated as Comparative Example 2.

(Filterability)

In the Examples and Comparative Examples, after filtration by using a regenerated cellulose filter having a pore diameter of 3.0 μm (manufactured by Advantec MFS, Inc.) to prepare a conductive polymer composition, filtration was performed through a hydrophilic-treated UPE filter having a pore diameter of 1.0 to 0.03 μm (manufactured by Entegris Inc.), thereby examining a pore diameter of the filter capable of filtrating the composition without clogging. The liquid-passing limits of the UPE filter through which the conductive polymer composition was filtrated in Examples 1 to 8 and Comparative Examples 1 to 2 are shown in Table 1.

Antistatic films in Examples 1 to 8 and Comparative Examples 1 to 2 and resist films used as an under layer were formed by spin coating with Spin coater MS-A200 (manufactured by Mikasa Co., Ltd.).

As to a positive chemically amplified resist, a positive chemically amplified electron beam resist SEBP-9012 available from Shin-Etsu Chemical Co., Ltd. was used. As to a negative chemically amplified electron beam resist, SEBN-1702 available from Shin-Etsu Chemical Co., Ltd. was used.

SEBP-9012 and SEBN-1702 were baked in an accuracy incubator at 110° C. for 240 seconds to remove a solvent, thereby forming films. On the upper layer, the antistatic films of Examples 1 to 8 and Comparative Examples 1 to 2 were formed by applying thereof with the foregoing spin coater and baking in an accuracy incubator at 90° C. for 90 seconds to remove solvent. The thicknesses of the resist films and the antistatic films were measured by VASE (manufactured by J. A. Woollam Co., Inc.), a spectroscopic ellipsometer with a variable incident angle.

(Film Formability)

When the film could be formed uniformly, it was evaluated as "good", and when defect derived from particles, visually-determined scrolled-coating unevenness, or partial striation was generated in the film, it was evaluated as "poor" and the reason was noted. These results are shown in Table 1.

(Peelability by Water Washing)

Onto the film of SEBP-9012 or SEBN-1702 obtained by the foregoing film-forming procedure, 2.0 mL of the conductive polymer composition was dropped, and then spin coated onto the entire of the resist film with a spinner. The spin-coating condition was controlled so as to give the film thickness of 80±5 nm. This was baked in an accuracy incubator at 90° C. for 5 minutes to remove solvent, thereby obtaining the antistatic film. The formed antistatic film was washed off with ion-exchanged water in a washing bottle. When the antistatic film was peeled uniformly within 10 seconds, it was evaluated as "good", and as for the samples that could not be evaluated (ununiform peeling or flaky film-fall), it was evaluated as "poor" and the reason was noted. These results are shown in Table 1.

(Resist Damage)

With respect to the substrate after the evaluation of peelability by water washing, when the color of the resist portion exposed by peeling the antistatic film was not changed, it was evaluated as "good", when the color was partially changed, it was evaluated as "moderate", and when the color was entirely changed, it was evaluated as "poor". These results are shown in Table 1.

(Viscosity)

The solid content of the conductive polymer compositions were set to 1.3% by weight in Examples 1 to 8 and Comparative Example 1, and 3.15% by weight in Comparative Example 2, and the liquid temperatures were adjusted to 25° C. Each 35 mL was measured to a measuring cell exclusively attached to a tuning fork vibro viscometer SV-10 (manufactured by A&D Company, Limited), and the viscosity immediately after the preparation was measured. These results are shown in Table 1.

(Surface Resistivity)

Onto the film of SEBP-9012 or SEBN-1702 obtained by the foregoing film-forming procedure, 2.0 mL of the conductive polymer composition was dropped, and then spin coated onto the entire of the resist film with a spinner. The spin-coating condition was controlled so as to give the film thickness of 80±5 nm. This was baked in an accuracy incubator at 90° C. for 5 minutes to remove solvent, thereby obtaining the antistatic films. The surface resistivity ($\Omega/\square$) of the antistatic film was measured with Loresta-GP MCP-T610 or Hiresta-UP MCP-HT450 (both are manufactured by Mitsubishi Chemical corp.). These results are shown in Table 1.

(Evaluation of Electron Beam Lithography and Change Ratio of Film Loss)

Evaluation of Peeling Process Before PEB

A positive chemically amplified resist SEBP-9012 was applied to a 6-inch silicon wafer by spin coating with MARK VIII (Coater/developer CLEAN TRACK, manufactured by Tokyo Electron Ltd.), and pre-baked at 110° C. for 240 seconds on a hot plate to prepare a resist film with a thickness of 150 nm <film thickness (T1)>. The conductive polymer composition was applied to the obtained wafer with the resist film by spin coating using MARK VIII in the same manner as described above, and baked at 90° C. for 90 seconds on a hot plate, to prepare a conductive polymer film with a thickness of 100 nm. After exposing by an electron beam exposure device (HL-800D manufactured by Hitachi High-Technologies Corporation, accelerating voltage: 50 keV), then the conductive polymer film was peeled by throwing pure water for 15 seconds, and baked at 90° C. for 240 seconds (PEB: post exposure bake). Then developing with an aqueous solution of 2.38% by mass tetramethylammonium hydroxide was carried out, and a positive pattern (film thickness of unexposed portion (T3)> was obtained.

Evaluation of Peeling Process after PEB

A positive chemically amplified resist SEBP-9012 was applied to a 6-inch silicon wafer by spin coating with MARK VIII (Coater/developer CLEAN TRACK, manufactured by Tokyo Electron Ltd.), and pre-baked at 110° C. for 240 seconds on a hot plate to prepare a resist film with a thickness of 150 nm <film thickness (T1)>. The conductive polymer composition was applied to the obtained wafer with the resist film by spin coating using MARK VIII in the same manner as described above, and baked at 90° C. for 90 seconds on a hot plate, to prepare a conductive polymer film with a thickness of 100 nm. After exposing by an electron beam exposure device (HL-800D manufactured by Hitachi High-Technologies Corporation, accelerating voltage: 50 keV), and baking at 90° C. for 240 seconds (PEB: post exposure bake), developing with an aqueous solution of 2.38% by mass tetramethylammonium hydroxide was carried out to obtain a positive pattern <the film thickness of an unexposed portion (T3)>.

A resist film without a conductive polymer film was also subjected to the same peeling process after PEB. The optimum exposure dose and the resist film thickness (T2) in an unexposed portion after exposure and development were determined. The change ratio in film loss (change ratio of film thickness) was calculated from the following equation in each of peeling processes before PEB and peeling processes after PEB. The results are shown in Table 2 and Table 3.

Change ratio of film loss in each process (%)={(T1−T3)−(T1−T2)/(T1−T2)}×100

Furthermore, the resist pattern obtained in each process was evaluated as follows.

The produced wafer with a pattern was observed under a top SEM (scanning electron microscope). The exposure dose in which a 400-nm line-and-space is resolved at a 1:1 is defined as the optimal exposure dose (sensitivity) (μC/cm$^2$), and the minimum dimension in the optimum exposure dose is defined as a resolution. The pattern area was cleaved, and whether the pattern profile was rectangular or not was determined by visual check of a SEM image. The results are shown in Table 2 and Table 3. The change ratio of sensitivity was calculated as a deviation (%) to the sensitivity of SEBP-9012.

A negative resist SEBN-1702 was subjected to the same process evaluation. The results are shown in Table 4 and Table 5. Since an unexposed portion was removed by a developer, the change ratio of film loss was evaluated by determining a film thickness of an exposed portion of a resist. The change ratio of sensitivity was calculated as a deviation (%) to the sensitivity of SEBN-1702.

Tables 1 to 5 show the filterability, film formability, peelability by water washing, resist damage, viscosity, surface resistivity, and lithography evaluation in an electron beam drawing machine of the antistatic film obtained from the conductive polymer composition prepared in each of Examples and Comparative Examples.

TABLE 1

|  | Filterability Pore size of filter (μm) | Film formability | Resist damage | Peelability by water washing | Viscosity (mPa · S) | surface resistivity (Ω/□) |
|---|---|---|---|---|---|---|
| Example 1 | 0.05 | good | good | good | 9.8 | 1.33E+05 |
| Example 2 | 0.05 | good | good | good | 11.7 | 2.10E+05 |
| Example 3 | 0.05 | good | good | good | 10.0 | 1.25E+05 |
| Example 4 | 0.05 | good | good | good | 10.2 | 5.00E+05 |
| Example 5 | 0.05 | good | good | good | 8.56 | 1.00E+06 |
| Example 6 | 0.05 | good | good | good | 12.4 | 9.48E+04 |
| Example 7 | 0.05 | good | good | good | 11.7 | 1.55E+06 |
| Example 8 | 0.05 | good | good | good | 12.0 | 1.76E+06 |
| Comparative Example 1 | 1.00 | poor (scrolled unevenness) | poor | poor (flaky film-fall) | 55.0 | 7.89E+04 |
| Comparative Example 2 | 0.05 | good | good | good | 3.05 | 1.72E+08 |

TABLE 2

Positive-type resist
Lithography evaluation of conductive polymer composition in peeling process before PEB (Combination of SEBP-9012 and Examples 1 to 8 and Comparative Examples 1 to 2)

|  | Sensitivity (μC/cm$^2$) | Resolution (nm) | Change ratio of sensitivity (%) | Change ratio of film loss (%) | Pattern cross-sectional profile |
|---|---|---|---|---|---|
| SEBP-9012 only | 20.8 | 80 | — | — | rectangle |
| Example 1 | 20.1 | 80 | −3.4 | 1.5 | rectangle |
| Example 2 | 20.0 | 80 | −3.8 | 2.3 | rectangle |
| Example 3 | 19.8 | 80 | −4.8 | 1.7 | rectangle |
| Example 4 | 20.3 | 80 | −2.4 | 3.2 | rectangle |
| Example 5 | 20.2 | 80 | −2.9 | 3.3 | rectangle |
| Example 6 | 20.0 | 80 | −3.8 | 2.0 | rectangle |
| Example 7 | 19.9 | 80 | −4.3 | 3.0 | rectangle |
| Example 8 | 19.8 | 80 | −4.8 | 2.5 | rectangle |
| Comparative Example 1 | cannot evaluate | — | — | — | — |
| Comparative Example 2 | 20.2 | 80 | −2.9 | 1.0 | T-top, bridge |

TABLE 3

Positive-type resist
Lithography evaluation of conductive polymer composition in peeling process after PEB (Combination of SEBP-9012 and Examples 1 to 8 and Comparative Examples 1 to 2)

|  | Sensitivity (μC/cm$^2$) | Resolution (nm) | Change ratio of sensitivity (%) | Change ratio of film loss (%) | Pattern cross-sectional profile |
|---|---|---|---|---|---|
| SEBP-9012 only | 20.8 | 80 | — | — | rectangle |
| Example 1 | 19.5 | 80 | −6.3 | 2.3 | rectangle |
| Example 2 | 19.3 | 80 | −7.2 | 2.9 | rectangle |
| Example 3 | 19.6 | 80 | −5.8 | 2.5 | rectangle |
| Example 4 | 19.6 | 80 | −5.8 | 3.1 | rectangle |
| Example 5 | 19.5 | 80 | −6.3 | 3.7 | rectangle |
| Example 6 | 19.4 | 80 | −6.7 | 3.5 | rectangle |
| Example 7 | 19.5 | 80 | −6.3 | 2.9 | rectangle |
| Example 8 | 19.3 | 80 | −7.2 | 3.2 | rectangle |

TABLE 3-continued

Positive-type resist
Lithography evaluation of conductive polymer composition in peeling process after PEB (Combination of SEBP-9012 and Examples 1 to 8 and Comparative Examples 1 to 2)

| | Sensitivity ($\mu C/cm^2$) | Resolution (nm) | Change ratio of sensitivity (%) | Change ratio of film loss (%) | Pattern cross-sectional profile |
|---|---|---|---|---|---|
| Comparative Example 1 | cannot evaluate | — | — | — | — |
| Comparative Example 2 | 19.7 | 80 | −5.3 | 1.0 | T-top, bridge |

TABLE 4

Negative-type resist
Lithography evaluation of conductive polymer composition in peeling process before PEB (Combination of SEBN-1702 and Examples 1 to 8 and Comparative Examples 1 to 2)

| | Sensitivity ($\mu C/cm^2$) | Resolution (nm) | Change ratio of sensitivity (%) | Change ratio of film loss (%) | Pattern cross-sectional profile |
|---|---|---|---|---|---|
| SEBN-1702 only | 20.5 | 80 | — | — | rectangle |
| Example 1 | 21.3 | 80 | 3.9 | 1.8 | rectangle |
| Example 2 | 21.7 | 80 | 5.8 | 2.5 | rectangle |
| Example 3 | 21.5 | 80 | 4.9 | 2.0 | rectangle |
| Example 4 | 21.5 | 80 | 4.9 | 3.2 | rectangle |
| Example 5 | 21.0 | 80 | 2.4 | 3.2 | rectangle |
| Example 6 | 21.7 | 80 | 5.8 | 3.5 | rectangle |
| Example 7 | 21.5 | 80 | 4.9 | 3.6 | rectangle |
| Example 8 | 21.4 | 80 | 4.4 | 3.2 | rectangle |
| Comparative Example 1 | cannot evaluate | — | — | — | — |
| Comparative Example 2 | 21.0 | 80 | 2.4 | 1.2 | rounded top |

TABLE 5

Negative-type resist
Lithography evaluation of conductive polymer composition in peeling process after PEB (Combination of SEBN-1702 and Examples 1 to 8 and Comparative Examples 1 to 2)

| | Sensitivity ($\mu C/cm^2$) | Resolution (nm) | Change ratio of sensitivity (%) | Change ratio of film loss (%) | Pattern cross-sectional profile |
|---|---|---|---|---|---|
| SEBN-1702 only | 20.5 | 80 | — | — | rectangle |
| Example 1 | 22.3 | 80 | 8.7 | 2.3 | rectangle |
| Example 2 | 22.5 | 80 | 9.8 | 3.0 | rectangle |
| Example 3 | 22.5 | 80 | 9.8 | 2.9 | rectangle |
| Example 4 | 22.4 | 80 | 9.3 | 3.1 | rectangle |
| Example 5 | 21.8 | 80 | 6.3 | 3.0 | rectangle |
| Example 6 | 22.2 | 80 | 8.3 | 3.9 | rectangle |
| Example 7 | 22.4 | 80 | 9.3 | 3.5 | rectangle |
| Example 8 | 22.3 | 80 | 8.8 | 3.9 | rectangle |
| Comparative Example 1 | cannot evaluate | — | — | — | — |
| Comparative Example 2 | 22.0 | 80 | 7.3 | 1.0 | rounded top |

As shown in Table 1, the inventive conductive polymer compositions of Examples 1 to 8 exhibited good filterability, film formability, and peelability by water washing equivalent to a polyaniline-based conductive polymer composition of Comparative Example 2. Each of these inventive conductive polymer compositions could give a uniform coating on a resist film with a spin coater. Examples 1 to 8 showed lower surface resistivity compared to the polyaniline-based conductive polymer composition of Comparative Example 2, and accordingly revealed more efficient conductivity as an antistatic film.

Comparative Example 1, made from a conductive polymer with polystyrene sulfonic acid as a dopant, showed high viscosity and poor filterability. The film forming of Comparative Example 1 with a spin coater, performed after passing through the filter with limit-pore size, resulted an ununiform film with occurring scrolled uneven coating that could be visually inspected. In peelability by water washing, the antistatic film fell in the form of flakes, and the flake fragments remained on the surface of a resist film even after spin-off. Moreover, the color change was observed over the entire resist portion exposed by peeling the antistatic film.

As shown in Tables 2 to 5, in the lithography evaluation using electron beam, the antistatic films obtained from the inventive conductive polymer compositions (Examples 1 to 8) exhibited good sensitivity and small sensitivity change as well as excellent resolution and pattern profile.

On the other hand, in Comparative Example 1, the lithography evaluation could not be performed since a uniform coating film could not be obtained due to poor film formability onto a resist film.

As described above, it has revealed that the inventive conductive polymer composition has excellent antistatic performance in electron beam-resist drawing as well as good applicability onto a resist and peelability with $H_2O$ and an alkaline solution, thereby being suitably used for electron beam lithography.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A coated article comprising an antistatic film formed from a conductive polymer composition on a body to be processed, wherein the body to be processed is a substrate having a chemically amplified resist film, and the conductive polymer composition comprises:

(A) an π-conjugated conductive polymer having at least one repeating unit shown by the following general formulae (1-1), (1-2), and (1-3); and (B) a dopant polymer which contains a repeating unit shown by the following general formula (2) and has a weight-average molecular weight in a range of 1,000 to 500,000;

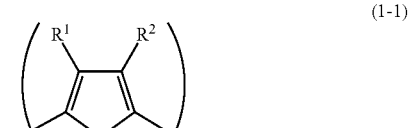

(1-1)

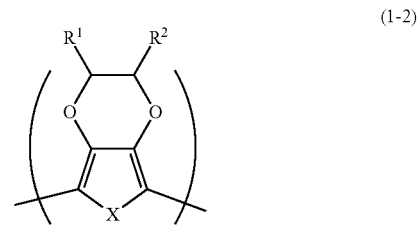

(1-2)

-continued (1-3)

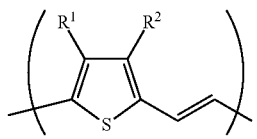

wherein "X" represents S, O, Se, Te, or $NR^5$; $R^1$ and $R^2$ each independently represent any of a hydrogen atom, a hydroxy group, a halogen atom, and a linear, branched, or cyclic monovalent hydrocarbon group having 1 to 20 carbon atoms and optionally containing a heteroatom; $R^1$ and $R^2$ are optionally bonded to each other at any positions to form a ring; $R^5$ represents a hydrogen atom, a linear or branched saturated or unsaturated alkyl group having 1 to 10 carbon atoms, or a substituted or unsubstituted aryl group having 6 to 10 carbon atoms; with the proviso that in the general formula (1-1), when "X" represents S, Se, or Te, or "X" represents $NR^5$ and $R^5$ represents a hydrogen atom, $R^1$ and $R^2$ do not both represent hydrogen atoms;

(2)

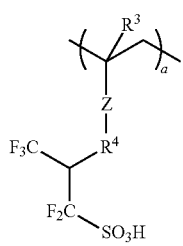

wherein $R^3$ represents a hydrogen atom or a methyl group; $R^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphtylene group, and an ester group; and "a" is 0<a≤1.0.

2. The coated article according to claim 1, wherein the repeating unit shown by the general formula (2) in the component (B) contains one or more repeating units selected from repeating units shown by the following general formulae (2-1) to (2-6), (2-1)

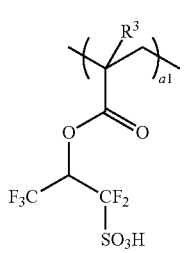

(2-2)

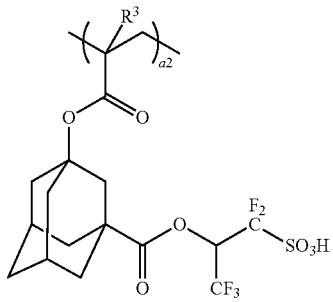

(2-3)

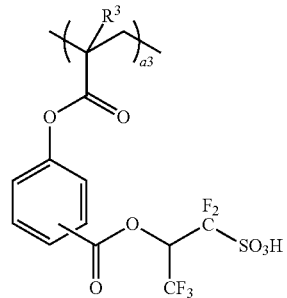

(2-4)

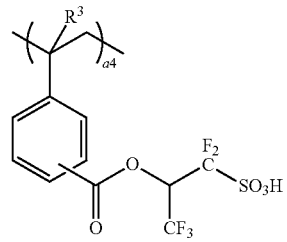

(2-5)

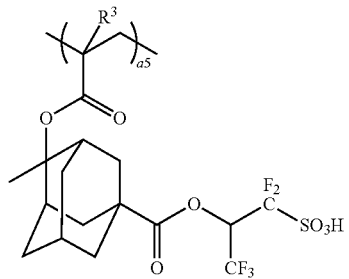

(2-6)

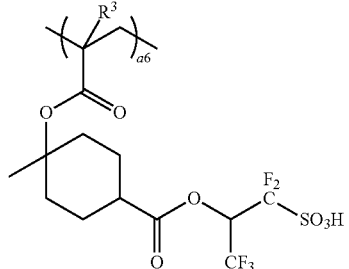

wherein $R^3$ has the same meaning as defined above; a1, a2, a3, a4, a5, and a6 are each 0≤a1≤1.0, 0≤a2≤1.0, 0≤a3≤1.0, 0≤a4≤1.0, 0≤a5≤1.0, 0≤a6≤1.0, and 0<a1+a2+a3+a4+a5+a6≤1.0.

3. The coated article according to claim 2, wherein the component (B) further contains a repeating unit shown by the following general formula (3),

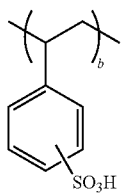

wherein "b" is 0<b<1.0.

4. The coated article according to claim 1, wherein the component (B) further contains a repeating unit shown by the following general formula (3),

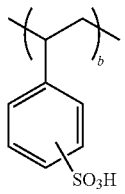

wherein "b" is 0<b<1.0.

5. A patterning process comprising the steps of: forming an antistatic film on a chemically amplified resist film of a substrate having the chemically amplified resist film by using a conductive polymer composition; irradiating in a pattern with electron beam; and developing with an alkaline developer to obtain a resist pattern, wherein the conductive polymer composition comprises:
(A) a π-conjugated conductive polymer having at least one repeating unit shown by the following general formulae (1-1), (1-2), and (1-3); and
(B) a dopant polymer which contains a repeating unit shown by the following general formula (2) and has a weight-average molecular weight in a range of 1,000 to 500,000;

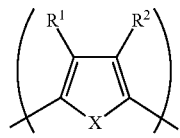

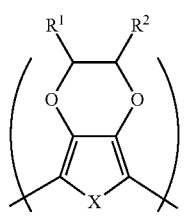

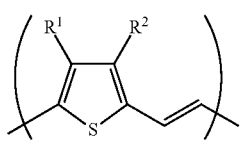

wherein "X" represents S, O, Se, Te, or $NR^5$; $R^1$ and $R^2$ each independently represent any of a hydrogen atom, a hydroxy group, a halogen atom, and a linear, branched, or cyclic monovalent hydrocarbon group having 1 to 20 carbon atoms and optionally containing a heteroatom; $R^1$ and $R^2$ are optionally bonded to each other at any positions to form a ring; $R^5$ represents a hydrogen atom, a linear or branched saturated or unsaturated alkyl group having 1 to 10 carbon atoms, or a substituted or unsubstituted aryl group having 6 to 10 carbon atoms; with the proviso that in the general formula (1-1), when "X" represents S, Se, or Te, or "X" represents $NR^5$ and $R^5$ represents a hydrogen atom, $R^1$ and $R^2$ do not both represent hydrogen atoms;

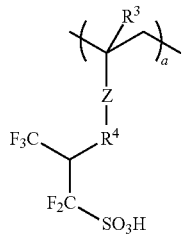

wherein $R^3$ represents a hydrogen atom or a methyl group; $R^4$ represents any of a single bond, an ester group, or a linear, branched, or cyclic hydrocarbon group having 1 to 12 carbon atoms and optionally containing either or both of an ether group and an ester group; "Z" represents any of a phenylene group, a naphtylene group, and an ester group; and "a" is 0<a≤1.0.

6. The patterning process according to claim 5, wherein the repeating unit shown by the general formula (2) in the component (B) contains one or more repeating units selected from repeating units shown by the following general formulae (2-1) to (2-6),

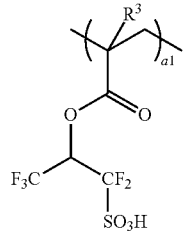

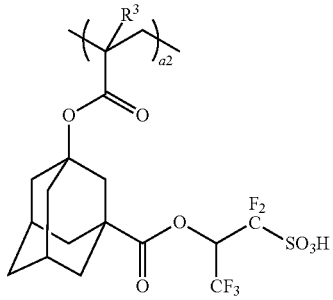

-continued

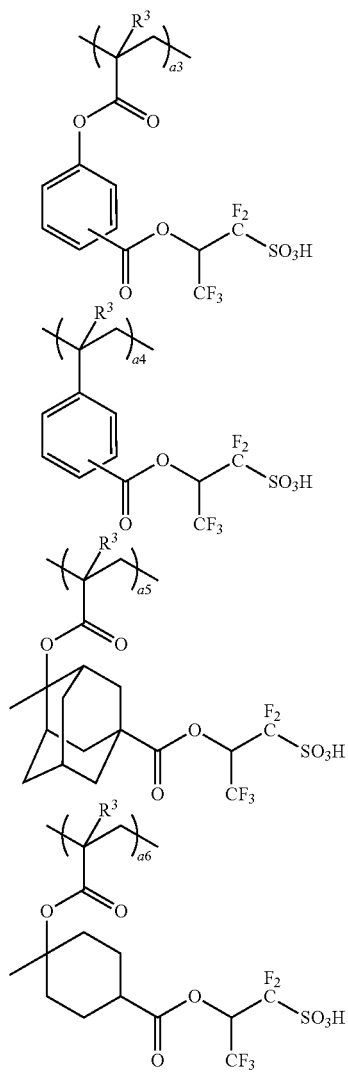

wherein $R^3$ has the same meaning as defined above; a1, a2, a3, a4, a5, and a6 are each $0 \leq a1 \leq 1.0$, $0 \leq a2 \leq 1.0$, $0 \leq a3 \leq 1.0$, $0 \leq a4 \leq 1.0$, $0 \leq a5 \leq 1.0$, $0 \leq a6 \leq 1.0$, and $0 < a1+a2+a3+a4+a5+a6 \leq 1.0$.

7. The patterning process according to claim 6, wherein the component (B) further contains a repeating unit shown by the following general formula (3),

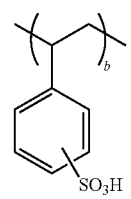

(3)

wherein "b" is $0 < b < 1.0$.

8. The patterning process according to claim 5, wherein the component (B) further contains a repeating unit shown by the following general formula (3),

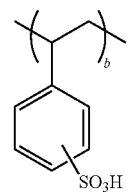

(3)

wherein "b" is $0 < b < 1.0$.

* * * * *